(12) United States Patent
Devilliers et al.

(10) Patent No.: US 11,841,617 B2
(45) Date of Patent: Dec. 12, 2023

(54) METHOD OF FORMING A NARROW TRENCH

(71) Applicant: Tokyo Electron Limited, Tokyo (JP)

(72) Inventors: Anton J. Devilliers, Clifton Park, NY (US); Jodi Grzeskowiak, Schenectady, NY (US); Daniel Fulford, Ballston Lake, NY (US); Richard A. Farrell, Nassau, NY (US); Jeffrey Smith, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 331 days.

(21) Appl. No.: 17/023,470

(22) Filed: Sep. 17, 2020

(65) Prior Publication Data
US 2021/0088904 A1 Mar. 25, 2021

Related U.S. Application Data

(60) Provisional application No. 62/902,434, filed on Sep. 19, 2019.

(51) Int. Cl.
*G03F 7/039* (2006.01)
*H01L 21/027* (2006.01)
(Continued)

(52) U.S. Cl.
CPC .............. *G03F 7/039* (2013.01); *G03F 7/16* (2013.01); *G03F 7/2002* (2013.01); *G03F 7/30* (2013.01); *H01L 21/0274* (2013.01)

(58) Field of Classification Search
CPC .......... G03F 7/039; G03F 7/16; G03F 7/2002; G03F 7/30; G03F 7/0274; G03F 7/0035;
(Continued)

(56) References Cited

U.S. PATENT DOCUMENTS 8,530,147 B2   9/2013   Yang
8,557,128 B2   10/2013  Millward
(Continued)

FOREIGN PATENT DOCUMENTS

KR   10-2017-0135896 A   12/2017

OTHER PUBLICATIONS

International Search Report and Written Opinion dated Feb. 5, 2021 in PCT/US2020/051175, 11 pages.

*Primary Examiner* — Mark F. Huff
*Assistant Examiner* — Alexander Nicholas Lee
(74) *Attorney, Agent, or Firm* — Oblon, McClelland, Maier & Neustadt, L.L.P.

(57) ABSTRACT

A method of forming a pattern on a substrate is provided. The method includes forming a first layer on an underlying layer of the substrate, where the first layer is patterned to have a first structure. The method also includes depositing a grafting material on side surfaces of the first structure, where the grafting material includes a solubility-shifting material. The method further includes diffusing the solubility-shifting material by a predetermined distance into a neighboring structure that abuts the solubility-shifting material, where the solubility-shifting material changes solubility of the neighboring structure in a developer, and removing soluble portions of the neighboring structure using the developer to form a second structure.

20 Claims, 16 Drawing Sheets

(51) Int. Cl.
*G03F 7/20* (2006.01)
*G03F 7/30* (2006.01)
*G03F 7/16* (2006.01)

(58) Field of Classification Search
CPC ....... G03F 7/405; G03F 7/40; H01L 21/0273; H01L 21/0274
See application file for complete search history.

(56) References Cited

U.S. PATENT DOCUMENTS

| | | | |
|---|---|---|---|
| 8,784,974 B2 | 7/2014 | Millward | |
| 8,801,894 B2 | 8/2014 | Millward | |
| 9,607,834 B2 | 3/2017 | Matsumoto et al. | |
| 9,753,370 B2 | 9/2017 | Hong et al. | |
| 9,818,610 B2 | 11/2017 | Matsumoto et al. | |
| 9,869,933 B2 | 1/2018 | Rowell et al. | |
| 10,061,199 B2 | 8/2018 | Devilliers | |
| 2008/0274413 A1 | 11/2008 | Millward | |
| 2009/0130612 A1 | 5/2009 | Yang | |
| 2009/0274980 A1* | 11/2009 | Kang | G03F 7/0035 430/311 |
| 2010/0130016 A1* | 5/2010 | DeVilliers | H01L 21/0273 438/703 |
| 2010/0163180 A1 | 7/2010 | Millward | |
| 2012/0223051 A1 | 9/2012 | Millward | |
| 2014/0290858 A1 | 10/2014 | Millward | |
| 2016/0062232 A1* | 3/2016 | Hong | G03F 7/40 430/325 |
| 2016/0181100 A1* | 6/2016 | deVilliers | H01L 21/0337 438/702 |
| 2016/0293405 A1 | 10/2016 | Matsumoto et al. | |
| 2016/0377982 A1* | 12/2016 | deVilliers | G03F 7/405 430/325 |
| 2017/0255103 A1* | 9/2017 | Rowell | H01L 21/0274 |
| 2017/0263443 A1 | 9/2017 | Matsumoto et al. | |

* cited by examiner

Cross-sectional views / Top-down views
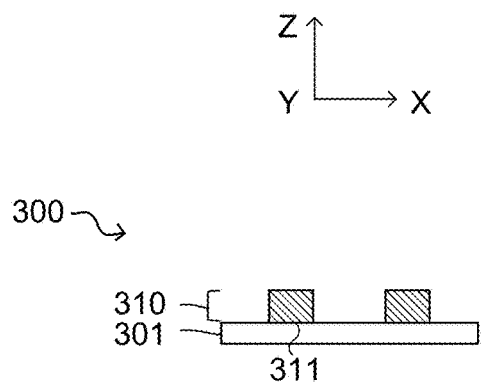
FIG. 3A
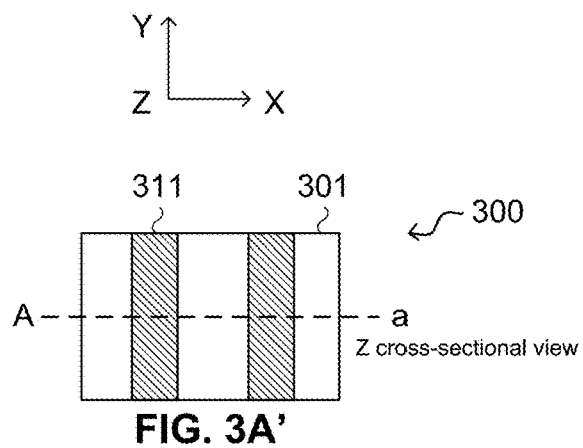
FIG. 3A'
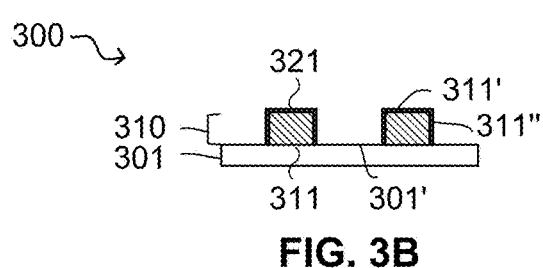
FIG. 3B
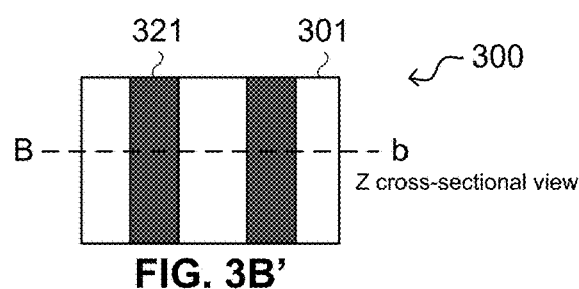
FIG. 3B'
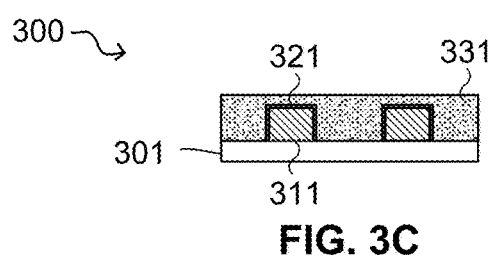
FIG. 3C
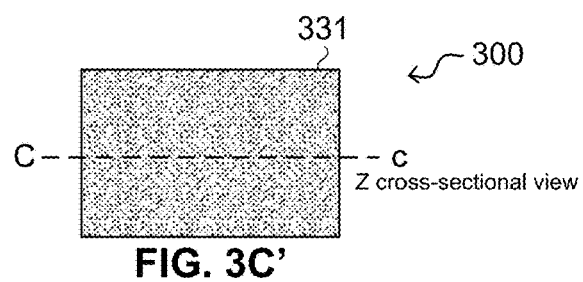
FIG. 3C'
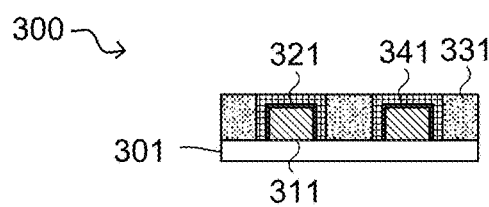
FIG. 3D
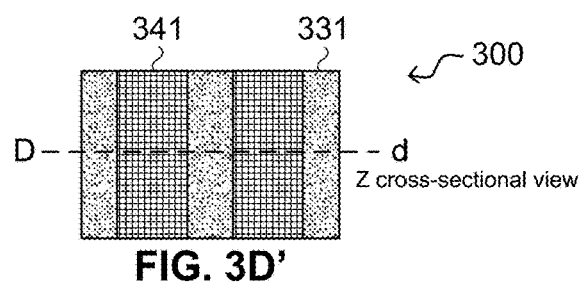
FIG. 3D'
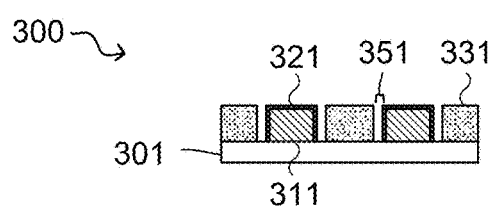
FIG. 3E
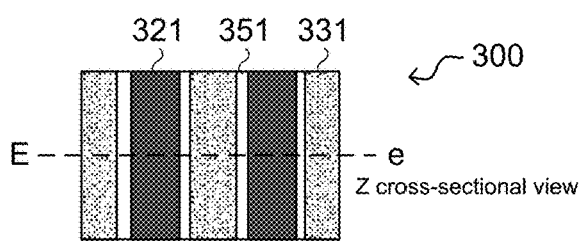
FIG. 3E'
FIG. 3

Cross-sectional views
Top-down views
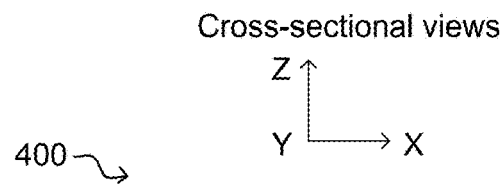
FIG. 4A
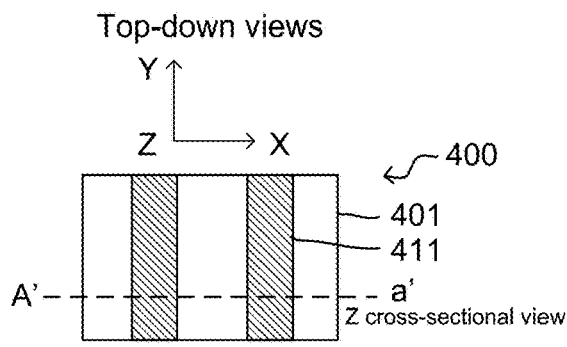
FIG. 4A'
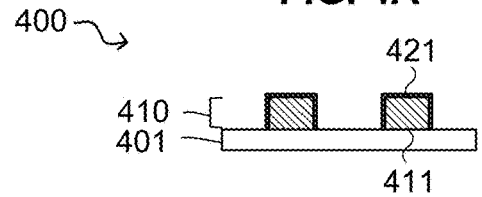
FIG. 4B
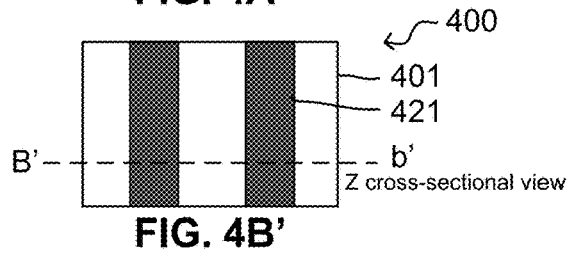
FIG. 4B'
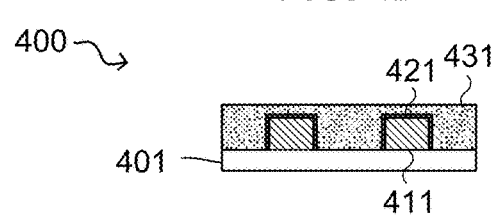
FIG. 4C
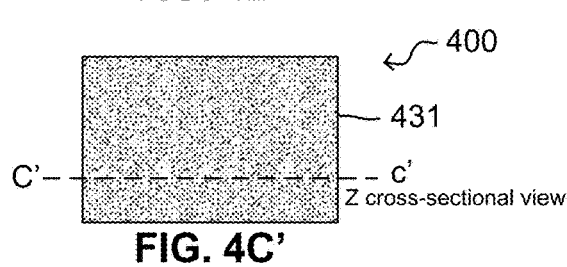
FIG. 4C'
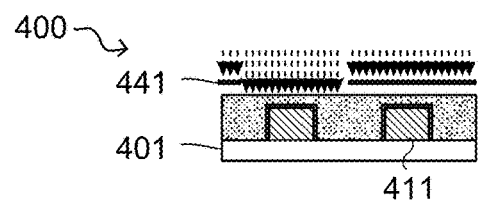
FIG. 4D
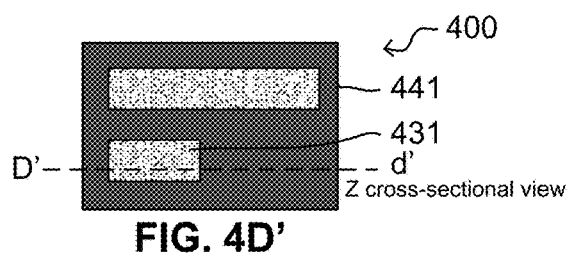
FIG. 4D'
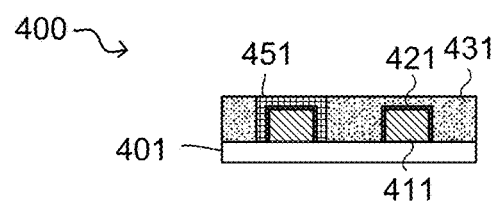
FIG. 4E
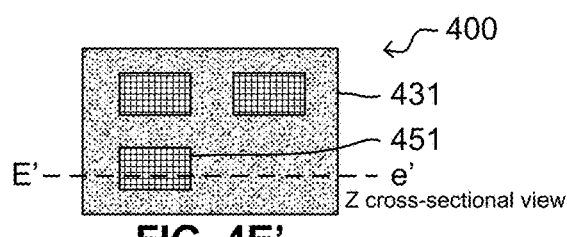
FIG. 4E'
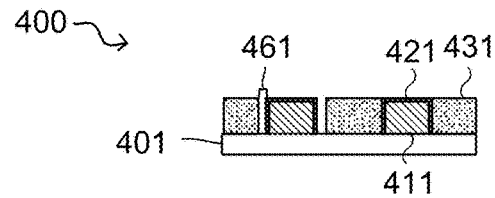
FIG. 4F
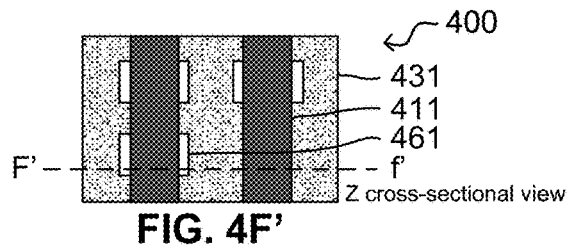
FIG. 4F'
FIG. 4

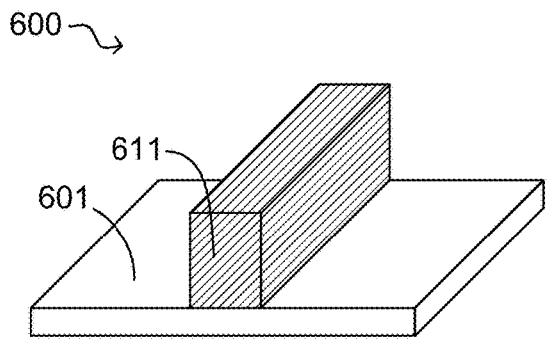
FIG. 6A
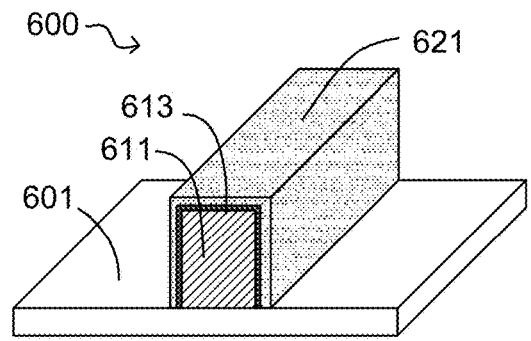
FIG. 6B
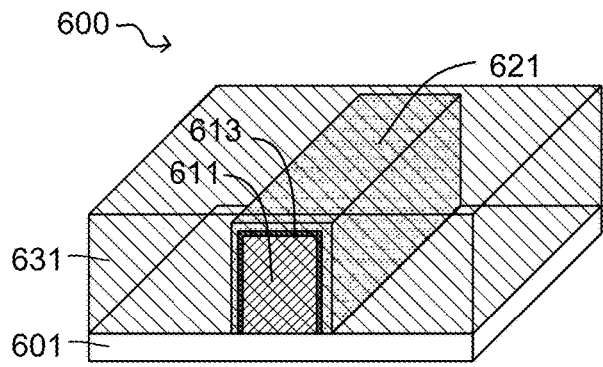
FIG. 6C
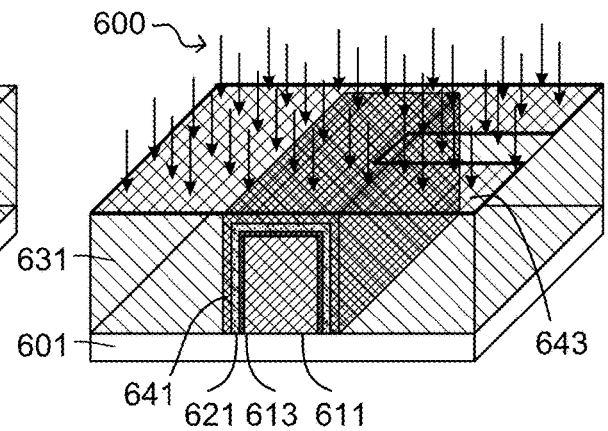
FIG. 6D
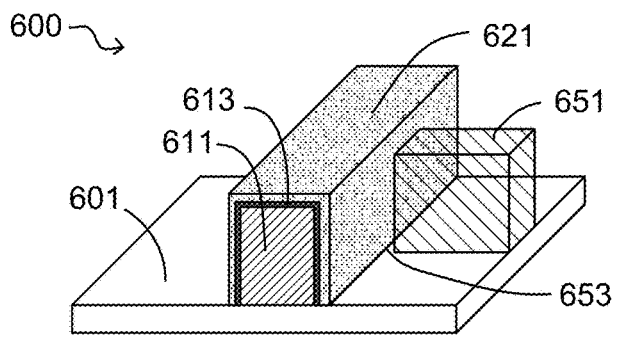
FIG. 6E
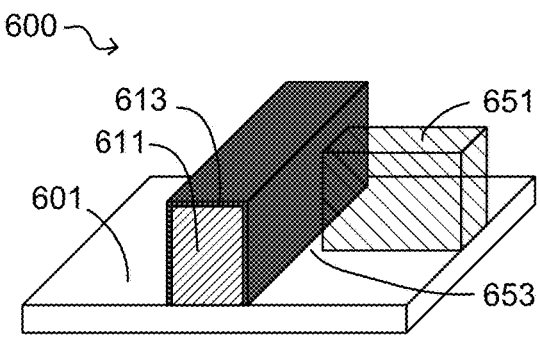
FIG. 6F
FIG. 6

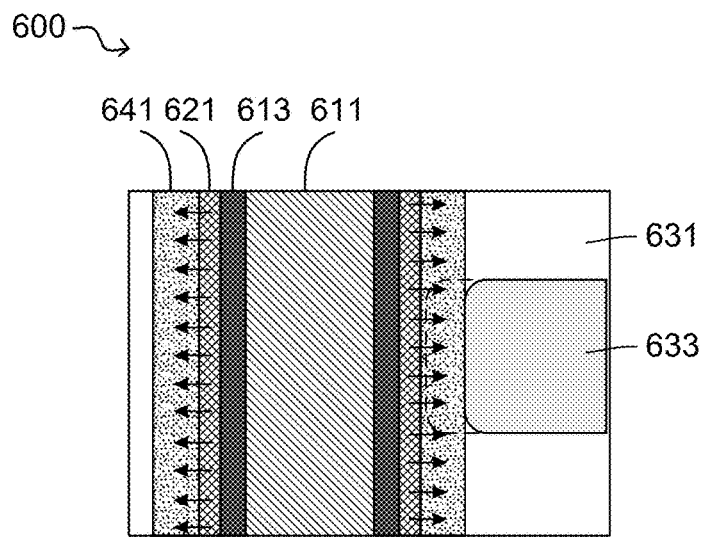
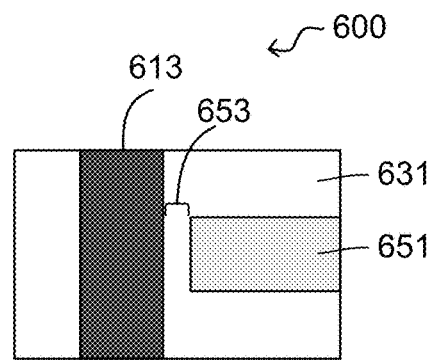
FIG. 6M          FIG. 6N
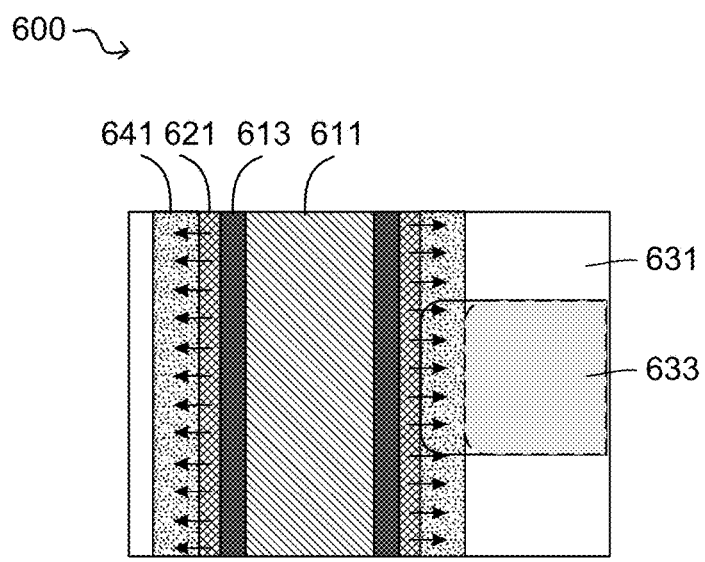
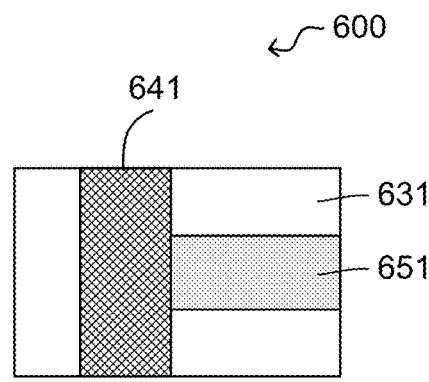
FIG. 6P          FIG. 6Q
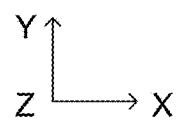
FIG. 6

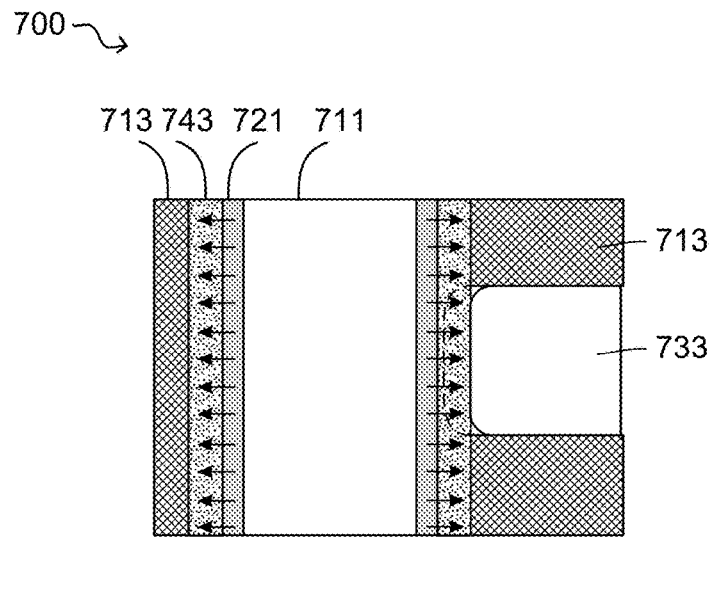
FIG. 7M
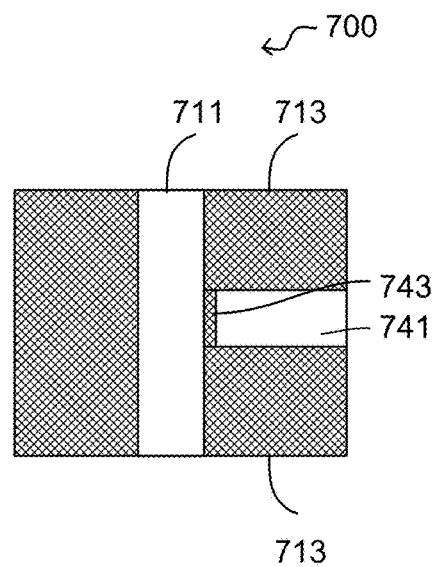
FIG. 7N
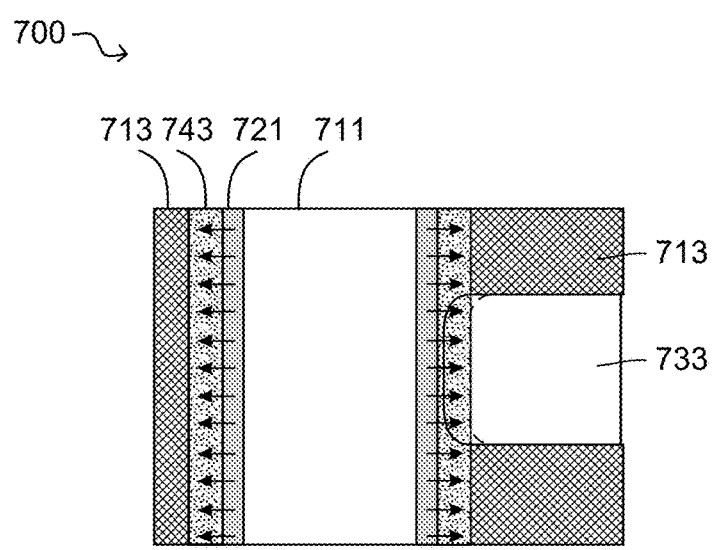
FIG. 7P
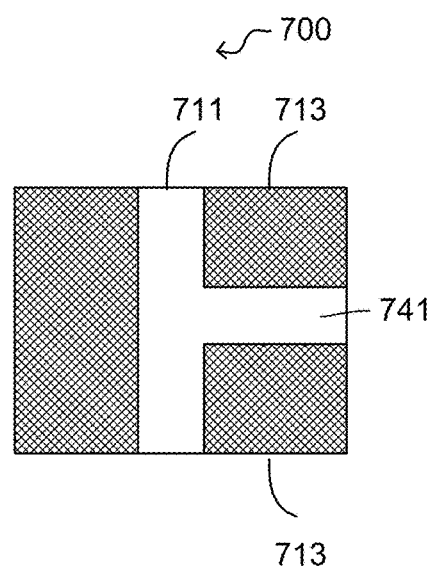
FIG. 7Q
FIG. 7
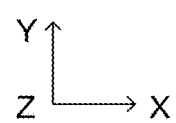

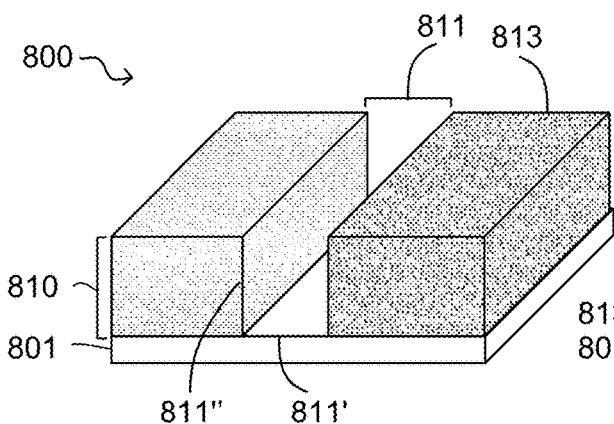
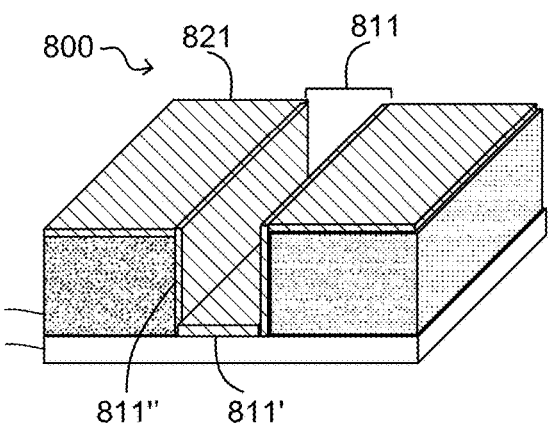
FIG. 8A  FIG. 8B
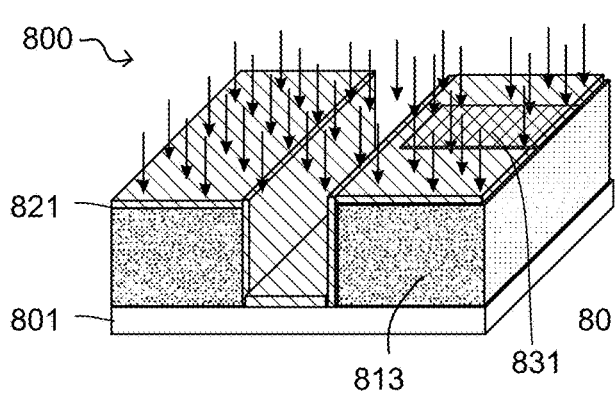
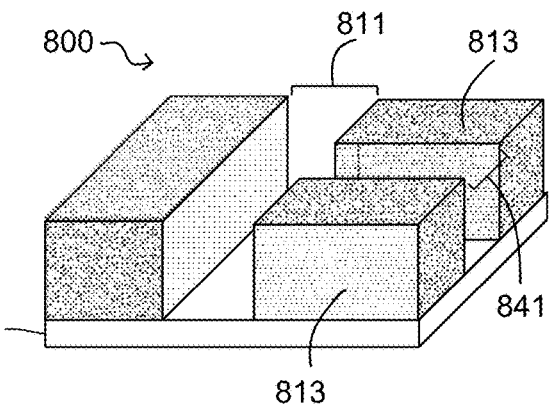
FIG. 8C  FIG. 8D
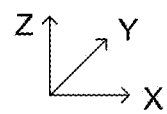
FIG. 8

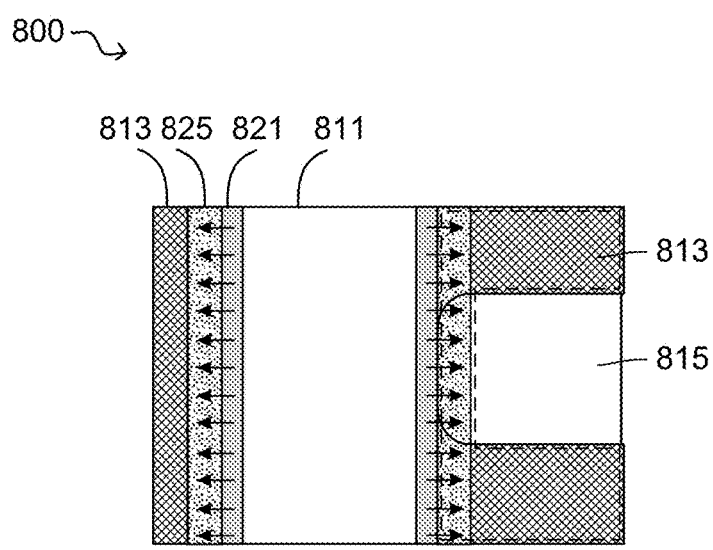
FIG. 8M
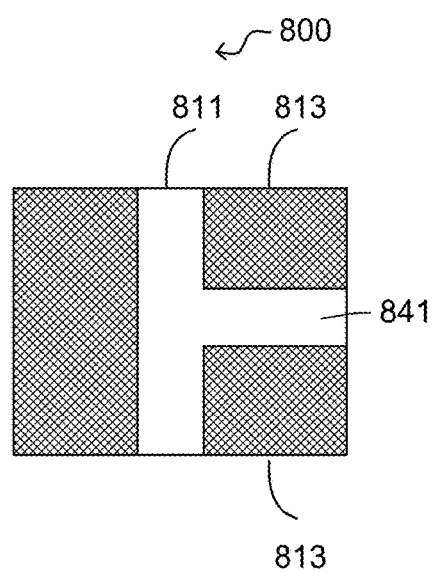
FIG. 8N
FIG. 8
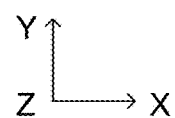

Cross-sectional views
Top-down views
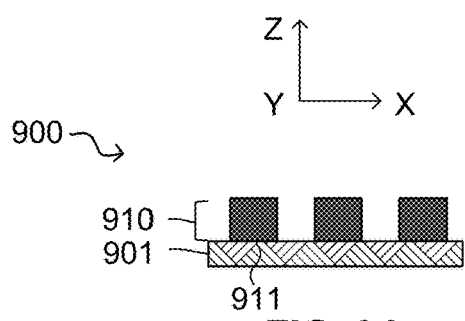
FIG. 9A
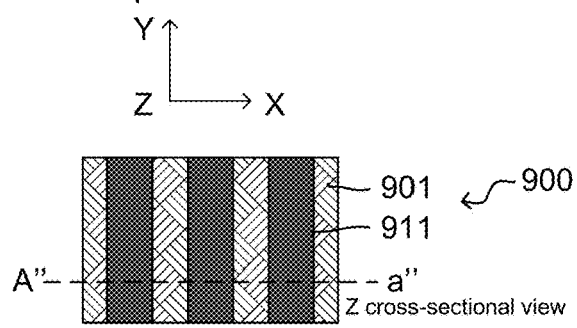
FIG. 9A'
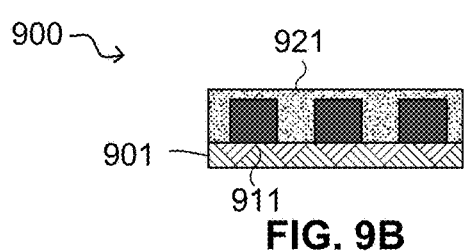
FIG. 9B
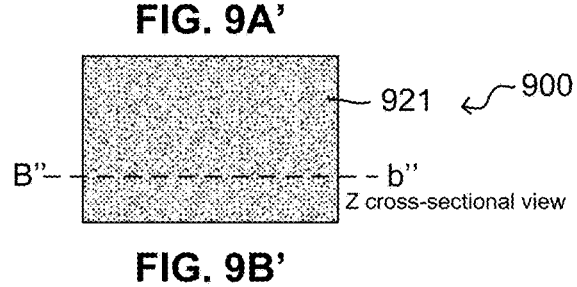
FIG. 9B'
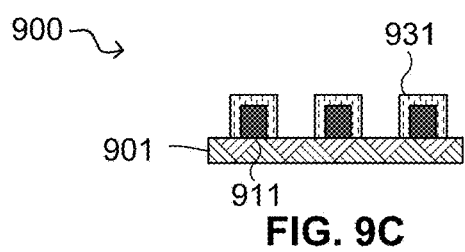
FIG. 9C
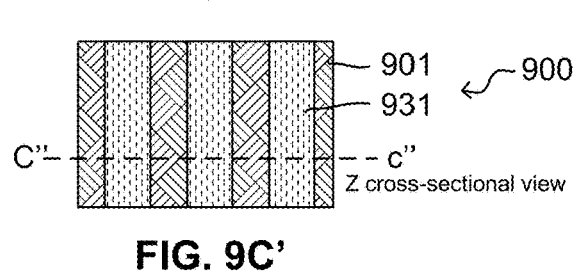
FIG. 9C'
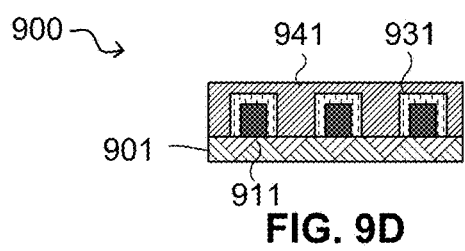
FIG. 9D
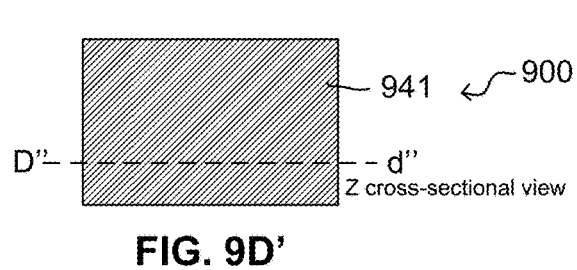
FIG. 9D'
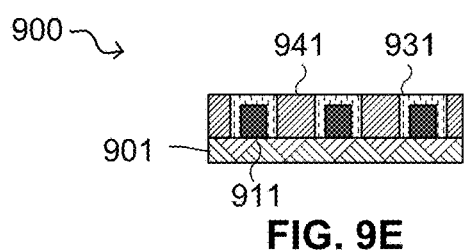
FIG. 9E
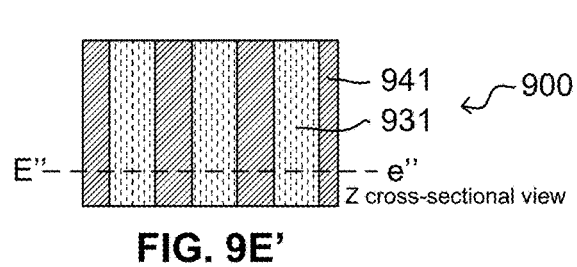
FIG. 9E'
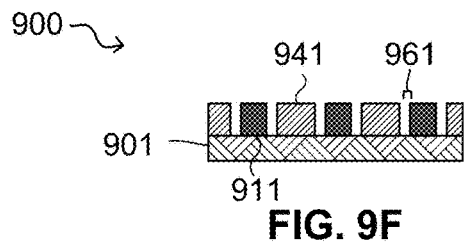
FIG. 9F
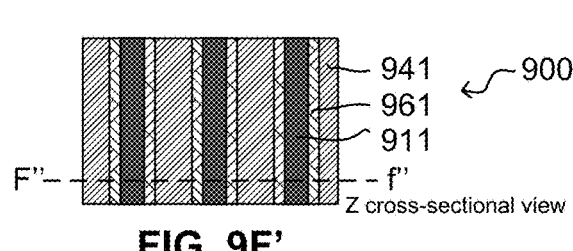
FIG. 9F'
FIG. 9

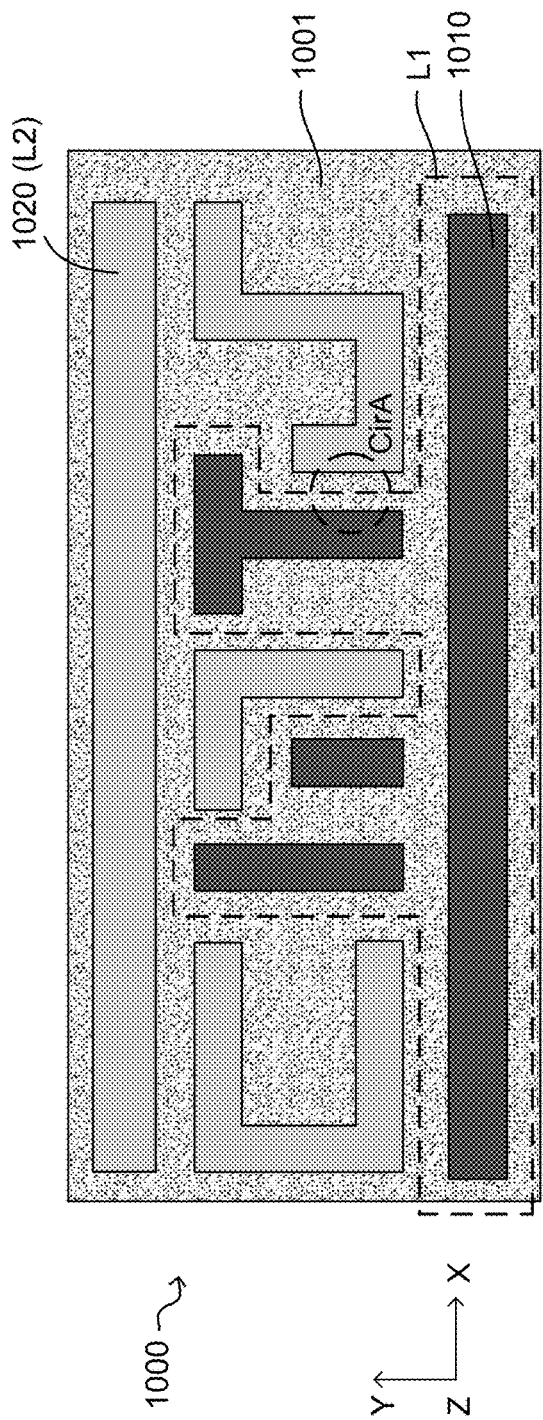
FIG. 10A
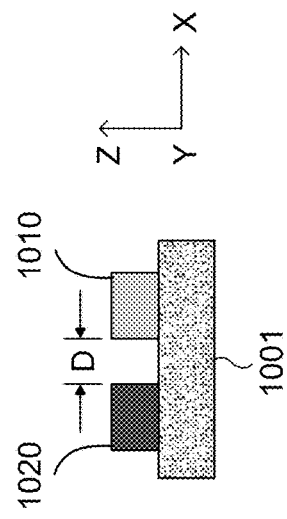
FIG. 10C
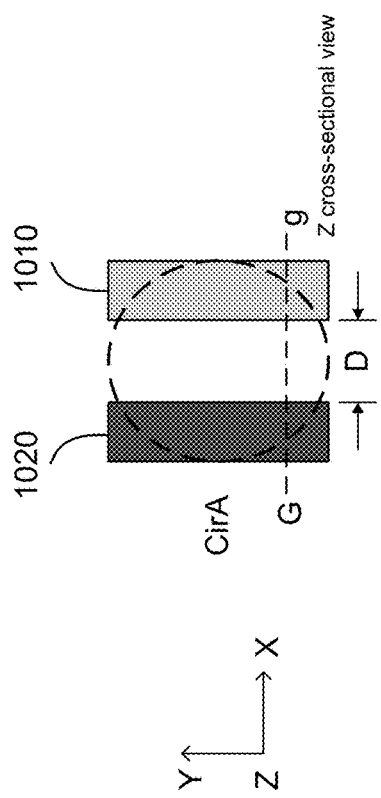
FIG. 10B
FIG. 10

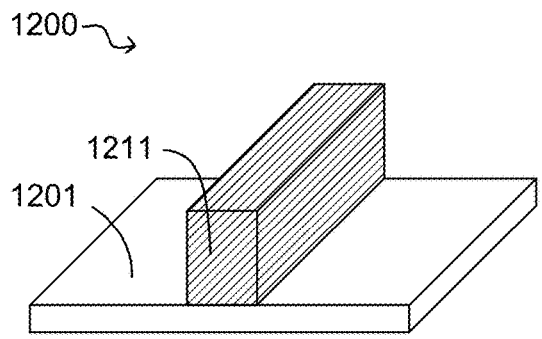
FIG. 12A
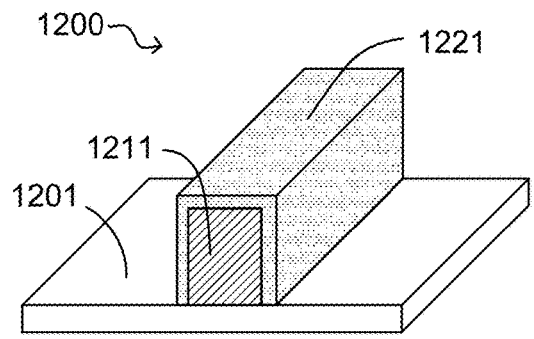
FIG. 12B
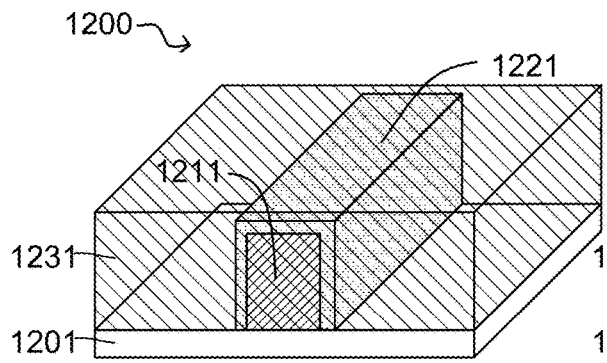
FIG. 12C
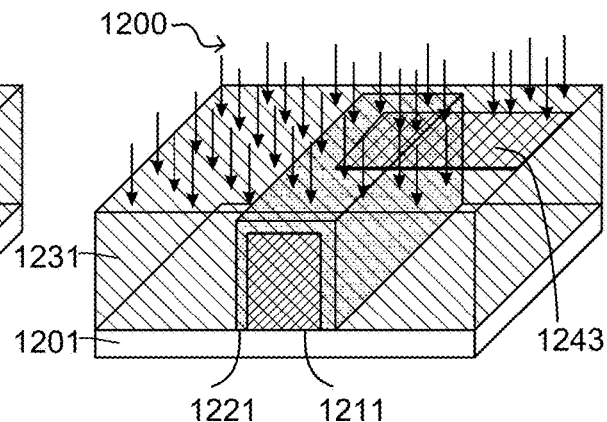
FIG. 12D
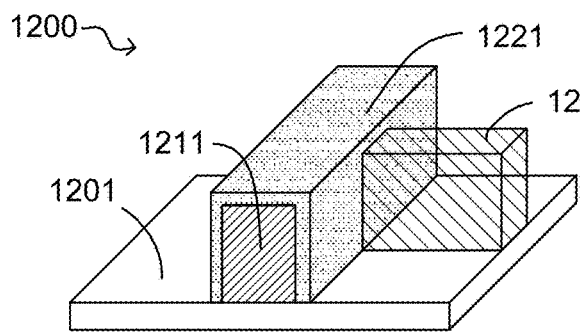
FIG. 12E
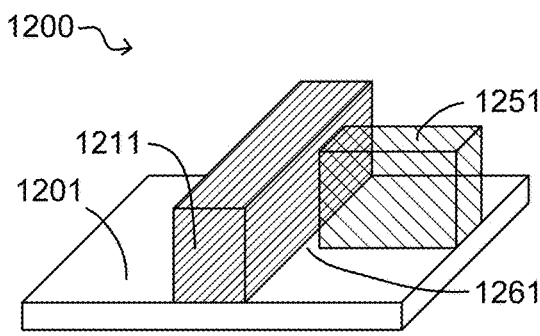
FIG. 12F
FIG. 12

METHOD OF FORMING A NARROW TRENCH

INCORPORATION BY REFERENCE

This present disclosure claims the benefit of U.S. Provisional Application No. 62/902,434, filed on Sep. 19, 2019, the entire content of which is incorporated herein by reference in its entirety.

FIELD OF THE INVENTION

This disclosure relates to microfabrication, including microfabrication of integrated circuits as well as processes involved in patterning semiconductor substrates.

BACKGROUND

In material processing methodologies (such as photolithography), creating patterned layers typically involves the application of a thin layer of radiation-sensitive material, such as photoresist, to an upper surface of a substrate. This radiation-sensitive material is transformed into a patterned mask that can be used to etch or transfer a pattern into an underlying layer on a substrate. Patterning of the radiation-sensitive material generally involves exposure by a radiation source through a reticle (and associated optics) onto the radiation-sensitive material using, for example, a photolithography system. This exposure creates a latent pattern within the radiation-sensitive material which can then be developed. Developing refers to dissolving and removing a portion of the radiation-sensitive material to yield a topographic or relief pattern. For example, developing can include removal of irradiated regions of the radiation-sensitive material (as in the case of positive photoresist), or non-irradiated regions (as in the case of negative resist) using a developing solvent. The relief pattern can then function as a mask layer.

SUMMARY

The present disclosure relates to forming a pattern on a substrate.

A first aspect is a method of forming a pattern on a substrate. The method includes forming a first layer on an underlying layer of the substrate, and the first layer is patterned to have a first structure. A grafting material is deposited on side surfaces of the first structure, and the grafting material includes a solubility-shifting material. The solubility-shifting material is diffused by a predetermined distance into a neighboring structure that abuts the solubility-shifting material, and the solubility-shifting material changes solubility of the neighboring structure in a developer. Soluble portions of the neighboring structure are removed using the developer to form a second structure.

In some embodiments, the first structure includes a first opening of the first layer. The neighboring structure can be a portion of the first layer, and the first layer can include a photoresist material. The second structure includes a second opening of the first layer, wherein a latent pattern of the second opening is formed by patterned exposure of the first layer to actinic radiation prior to diffusing the solubility-shifting material. In one example, the solubility-shifting material renders the neighboring structure insoluble to the developer, and the first opening is spaced apart from the second opening by at least the predetermined distance. In another example, the solubility-shifting material renders the neighboring structure soluble to the developer, and the first opening is joined with the second opening.

In some embodiments, the first structure includes a mandrel or a line. The neighboring structure can be a portion of the first layer. Depositing the grafting material is accomplished by coating the substrate with a solution having the grafting material wherein the grafting material is deposited on all uncovered surfaces of the substrate. The method, after diffusing the solubility-shifting material, can further include removing the grafting material from the substrate, and depositing a photoresist material over the substrate to form a latent pattern of the second structure, where the photoresist material abuts the first structure. For example, the solubility-shifting material can render the abutting portion of the filler material soluble to the developer, and the first structure can be spaced apart from the second structure by at least the predetermined distance.

In some embodiments, the first structure includes a mandrel or a line, and the neighboring structure can be a photoresist material deposited on the substrate after depositing the grafting material.

A second aspect is a method of forming a pattern on a substrate. The method includes forming a patterned first layer on an underlying layer of the substrate, where the patterned first layer includes a first material and the underlying layer includes a second material that is chemically different from the first material. The patterned first layer has a first structure. A grafting material is deposited on the substrate, and the grafting material selectively adheres to uncovered surfaces of the first structure. The grafting material includes a solubility-shifting material. A filler material is deposited on the substrate, and the filler material abuts the grafting material. The solubility-shifting material is diffused by a predetermined distance into an abutting portion of the filler material, and the solubility-shifting material changes solubility of the abutting portion of the filler material in a developer. Soluble portions of the filler material are removed using the developer so that the remaining portions of the filler material form a second structure.

In some embodiments, the solubility-shifting material renders the abutting portion of the filler material soluble to the developer, and the first structure is spaced apart from the second structure by at least the predetermined distance. In alternative embodiments, the solubility-shifting material renders the abutting portion of the filler material insoluble to the developer, and the first structure is in contact with the second structure.

In some embodiments, the solubility-shifting material includes a thermal acid generator, and the method may further include activating the thermal acid generator by heat prior to diffusing the solubility-shifting material into the filler material. In some embodiments, the solubility-shifting material includes a photo acid generator, and the method may further include activating the photo acid generator by actinic radiation prior to diffusing the solubility-shifting material into the filler material. For example, the actinic radiation can be performed with a photomask so that the solubility-shifting material is activated by patterned exposure of actinic radiation. In some embodiments, the solubility-shifting material includes a base that neutralizes an acid.

In some embodiments, the filler material includes a photoresist material. The method may further include forming a latent pattern of the second structure in the photoresist material via patterned exposure of actinic radiation, prior to diffusing the solubility-shifting material into the filler material. In some examples, the latent pattern may overlap the abutting portion of the photoresist material.

In some embodiments, the first structure includes a mandrel or a line. The mandrel or the line may be hardened prior to depositing the grafting material on the substrate.

A third aspect is a method of forming a pattern on a substrate. The method includes forming a patterned first layer on an underlying layer of the substrate, and the patterned first layer has a first structure. A grafting material is deposited on the substrate, and the grafting material selectively adheres to uncovered surfaces of the first structure, resulting in a predetermined thickness of the grafting material on sidewalls of the first structure. A second structure is formed on the substrate from a photoresist, and the second structure abuts the grafting material. The grafting material is removed so that the first structure is spaced apart from the second structure by a distance that corresponds to the predetermined thickness.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

FIGS. 3, 3A, 3B, 3C, 3D, 3E, and 3A', 3B', 3C', 3D', and 3E' show schematic cross-sectional views and top-down views of a substrate at various intermediate steps of pattern formation with a thermal acid generator (TAG), in accordance with embodiments of the present disclosure.

FIGS. 4, 4A, 4B, 4C, 4D, 4E, 4F, and 4A', 4B', 4C', 4D', 4E', and 4F' show schematic cross-sectional views and top-down views of a substrate at various intermediate steps of pattern formation with a photo acid generator (PAG), in accordance with embodiments of the present disclosure.

FIGS. 5, 5A, 5B, 5C, 5D, 5E, 5F, 5M, 5N, 5P, 5Q, and 6, 6A, 6B, 6C, 6D, 6E, 6F, 6M, 6N, 6P, 6Q, and 7, 7A, 7B, 7C, 7D, 7M, 7N, 7P, 7Q, and 8, 8A, 8B, 8C, 8D, 8M, and 8N illustrate embodiments for using functional grafting materials to create gaps or connections between structures or openings despite overlay errors or photolithographic misalignment, in accordance with embodiments of the present disclosure.

FIGS. 9, 9A, 9B, 9C, 9D, 9E, 9F, and 9A', 9B', 9C', 9D', 9E', and 9F' show schematic cross-sectional views and top-down views of a substrate at various intermediate steps of pattern formation in accordance with embodiments of the present disclosure.

FIGS. 10, 10A, 10B, and 10C show pattern formation on a substrate, in accordance with the example process of FIG. 9.

FIGS. 12, 12A, 12B, 12C, 12D, 12E, and 12F show schematic 3D views and top-down views of a substrate at various intermediate steps of pattern formation in accordance with some embodiments of the present disclosure.

DETAILED DESCRIPTION

Figure 1:
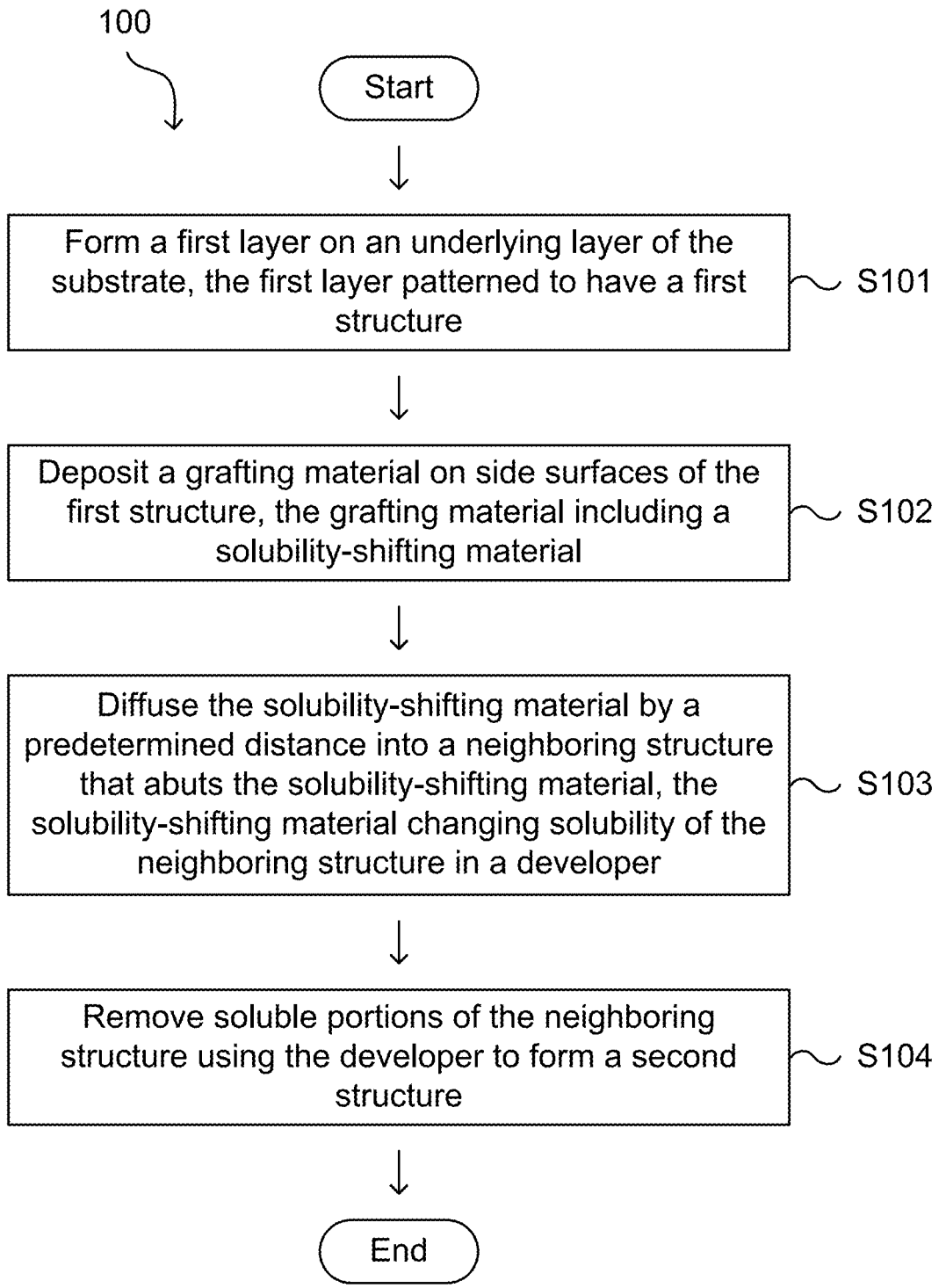
FIG. 1 is a flowchart of a method of forming a pattern on a substrate in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

One approach to print features at sub-resolution pitches has been to split the pattern between two masks at relaxed pitches and recombine in successive lithography and etch steps. This approach, however, may suffer from overlay error and edge placement error (EPE). One disadvantage of this approach is that splitting a patterning into two exposures and etches reduces the throughput. A second disadvantage is misalignment from multi-patterning. Anti-spacer is a self-aligned process that is not resolution limited which addresses both of these challenges at once. In addition, similar techniques described herein for anti-spacer formation can be used for "snap to" and "snap away" technology. Snap technology also mitigates the effects of overlay by using a reactive species to edge set.

Anti-spacer technology uses the diffusion length of a reactive species to define a critical dimension (CD), creating either a narrow trench or a slot contact for example. This CD can be tuned through molecular weight modification of the reactive species, molecular structure of the reactive species, and the bake temperature/time. If the reactive species can be controlled spatially via exposure through a mask or selective deposition, then instead of a narrow trench, a narrow slot contact can be formed. Another approach to creating a narrow slot contact is using a keep/cut mask after the formation of a narrow trench. This technique, however, introduces another lithographic exposure and film stack. In this disclosure for ease of explanation, examples will focus on use of acid as the reactive species.

Techniques herein include process flows for patterning substrates using diffusion lengths of solubility-shifting materials to form narrow trenches or provide buffers (i.e., form slot contacts) between adjacent structures or openings.

Techniques herein include forming a patterned first layer with a first structure, depositing a grafting material that includes a solubility-shifting material on side surfaces of the first structure, diffusing the solubility-shifting material into a neighboring structure, and removing soluble portions of the neighboring structure. By controlling the diffusion conditions and duration, a sub-resolution CD can be defined and leveraged for "snap to" and "snap away" technology.

FIG. 1 is a flowchart of a method 100 for forming a pattern on a substrate in accordance with some embodiments of the present disclosure. The method 100 begins with step S101 where a first layer is formed on an underlying layer of the substrate and patterned to have a first structure. The first structure can, for example, include a mandrel/line (e.g., FIGS. 3-6 and 9-10) or an opening (e.g., FIGS. 7-8) of the first layer.

At step S102, a grafting material that includes a solubility-shifting material is deposited on side surfaces of the first structure. In some embodiments, the grafting material selectively adheres to uncovered surfaces of the first structure line (e.g., FIGS. 3-6). In other embodiments, the grafting material is deposited non-selectively on all uncovered surfaces of the substrate (e.g., FIGS. 7-10). For example, the grafting material may be deposited on side surfaces and a bottom surface of an opening, and on top surfaces of the patterned first layer (e.g., FIGS. 7-8). In another example, the grafting material may be deposited on side surfaces and a top surface of a mandrel, and on top surfaces of the underlying layer (e.g., FIGS. 9-10).

At steps S103 and S104, the solubility-shifting material is diffused by a predetermined distance into a neighboring structure that abuts the solubility-shifting material, and soluble portions of the neighboring structure are then removed using the developer to form a second structure. The solubility-shifting material is designed to change solubility of the neighboring structure in a specific developer. In some embodiments, the solubility-shifting material renders the neighboring structure soluble to the specific developer so that the first structure is spaced apart from the second structure by at least the predetermined distance (e.g., FIGS. 3-6 and 9-10). In some embodiments, the solubility-shifting material renders the neighboring structure insoluble to the specific developer so that the first structure is in contact with the second structure (e.g., FIGS. 5-6). In some embodiments, the solubility-shifting material renders the neighboring structure soluble to the specific developer so that the first structure is in contact with the second structure (e.g., FIGS. 7-8). In some embodiments, the solubility-shifting material renders the neighboring structure insoluble to the specific developer so that the first structure is spaced apart from the second structure by at least the predetermined distance (e.g., FIGS. 7-8). Additionally, in some embodiments, the solubility-shifting material may be activated prior to step S103.

Figure 7:
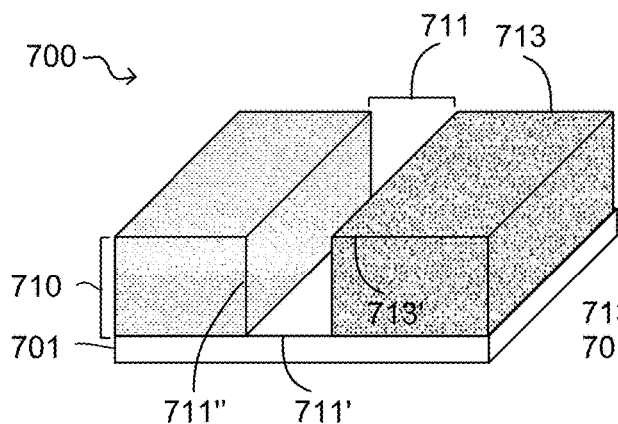
Figure 7:
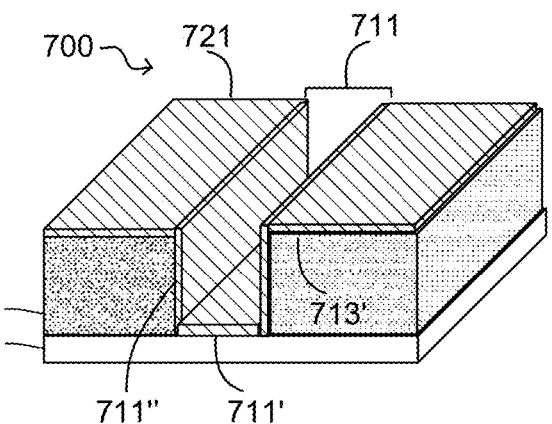
Figure 7:
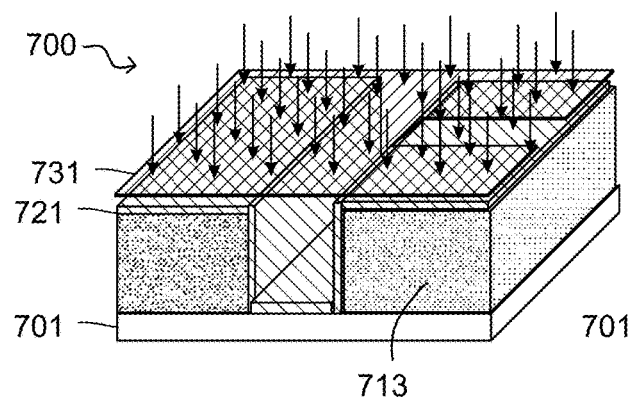
Figure 7:
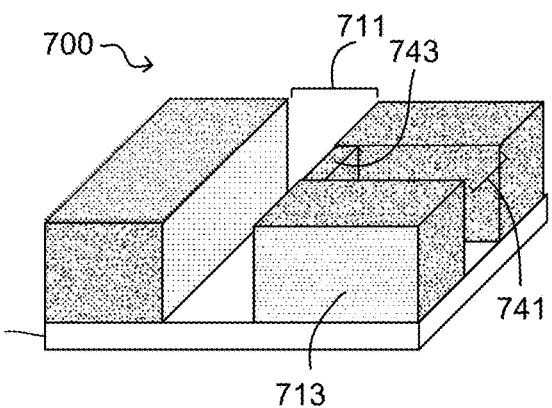
Figure 7:
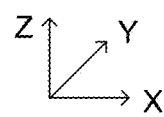

Still referring to steps S103 and S104, the neighboring structure is a portion of the first layer in an example where the first structure is an opening of the first layer (e.g., FIGS. 7-8). As a result, the second structure can be a second opening that is either spaced apart from or in contact with the first opening. In another example where the first structure is a mandrel or a line, the neighboring structure may be a portion of the first layer (e.g., FIGS. 9-10) or a photoresist material layer (e.g., FIGS. 3-6) deposited on the substrate after depositing the grafting material. In fact, the method 100 includes at least eleven embodiments (e.g., FIGS. 3-10) representing various process flows, each of which will be explained in detail later.

Figure 2:
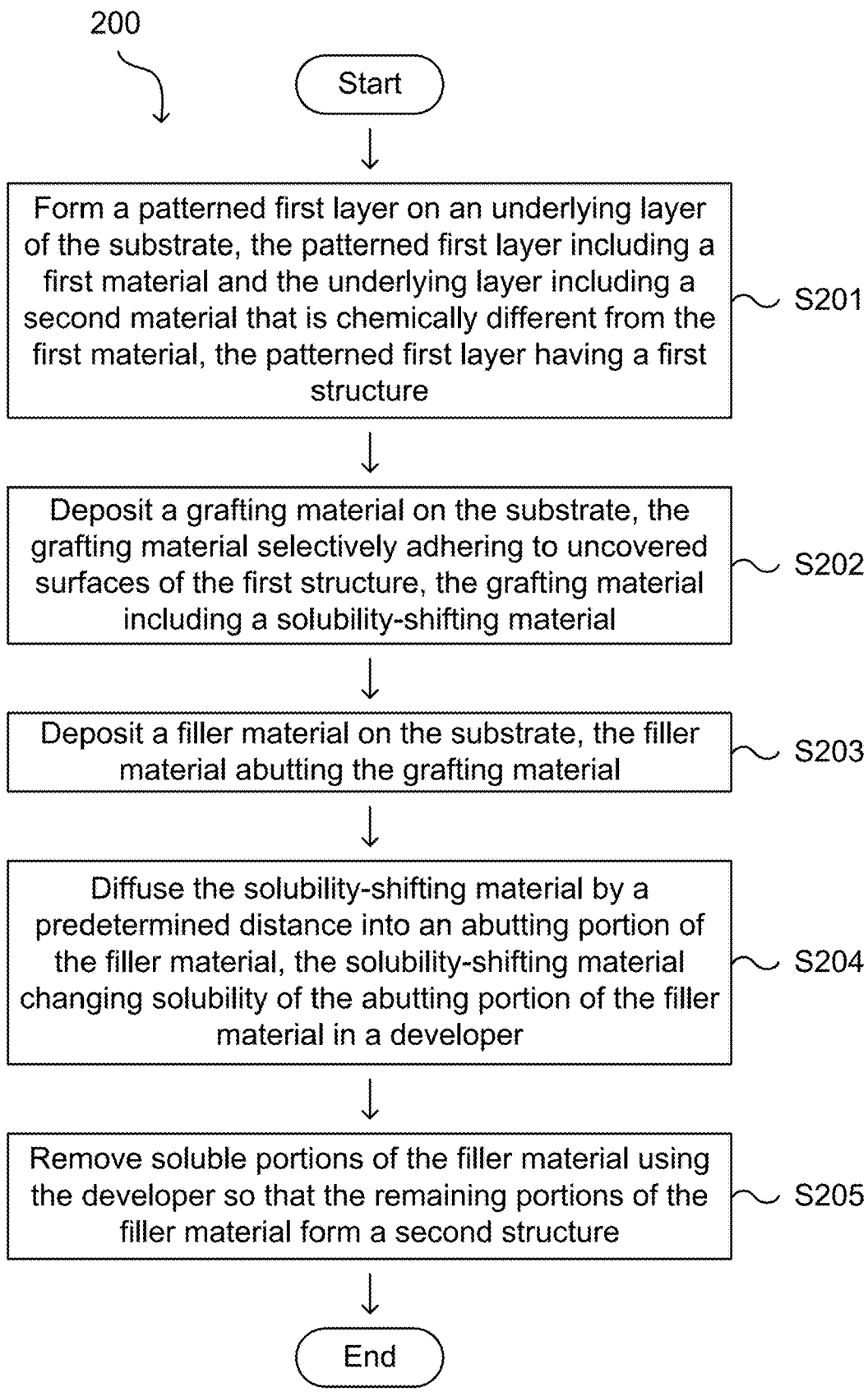
FIG. 2 is a flowchart of a method of forming a pattern on a substrate in accordance with some embodiments of the present disclosure.

FIG. 2 is a flowchart of a method 200 for forming a pattern on a substrate in accordance with some embodiments of the present disclosure. The method 200 can include at least six embodiments (e.g., FIGS. 3-6) of the method 100 in FIG. 1. At step S201, a patterned first layer is formed on an underlying layer of the substrate. The patterned first layer includes a first material, and the underlying layer includes a second material that is chemically different from the first material. The patterned first layer can also have a first structure, such as a mandrel or a line. For example, the mandrel can be made of a first photoresist material. Note that the discussion for the method 200 will be focused on a first photoresist material and a mandrel, but the first material may also be a hardmask material and the first structure may include other structures.

At step S202, a grafting material that includes a solubility-shifting material is deposited on the substrate, where the grafting material selectively adheres to uncovered surfaces of the first structure. The grafting material (also called a brush) is a polymer or short chain polymer with an attachment group. Based on a particular head group selected, the grafting material can attach to surfaces of specific materials without attaching to surfaces of other materials. The grafting material can be a self-assembled monolayer (SAM). In some embodiments, the grafting material is preferably more polymeric than formulated with hydrocarbon chains. The grafting material can be applied via spin-on deposition, physical vapor deposition, or otherwise. In some embodiments, after deposition of a particular grafting material, a bake processes is executed. The bake bonds the grafting material to the first photoresist material, without bonding to the underlying layer. Unbonded material (such as floor material) can then be removed using a solvent strip process. The other side of the grafting material can include a functional group such as a thermal acid generator (TAG), a photo acid generator (PAG), a base, or another solubility-shifting material.

At step S203, a filler material is deposited on the substrate, where the filler material abuts the grafting material. For example, an overcoat of the filler material can be deposited over the patterned first layer. The filler material can be a second photoresist material or another filler material that is responsive to solubility-shifting materials. In some embodiments, this filler material is essentially selected to react with acid to become soluble in a developer. One example of the filler material primarily used in this disclosure is a polymer with a protecting group that reacts with acid to become soluble in a given developer.

At step S204, the solubility-shifting material is diffused by a predetermined distance into an abutting portion of the filler material so that the solubility-shifting material changes solubility of the abutting portion of the filler material in a specific developer. At step S205, soluble portions of the filler material are removed using the developer so that the remaining portions of the filler material form a second structure. In some embodiments, the solubility-shifting material renders the abutting portion of the filler material soluble to the developer. As a result, the first structure is spaced apart from the second structure by at least the predetermined distance. In other embodiments, the solubility-shifting material renders the abutting portion of the filler material insoluble to the developer so that the first structure is in contact with the second structure. Additionally, an activation step that activates the solubility-shifting material may be executed prior to step S204 in some embodiments.

FIG. 3 shows schematic cross-sectional views and top-down views of a substrate 300 at various intermediate steps of pattern formation with a TAG in accordance with embodiments of the present disclosure. Particularly, FIG. 3 shows a method of forming narrow trenches and slot contacts using a grafting material with a functional group that is a TAG and can be an embodiment of the method 200 in FIG. 2. Therefore, some descriptions have been provided above and will be omitted here for simplicity purposes.

FIGS. 3A'-3E' are top-down views of the substrate 300, and FIGS. 3A-3E are corresponding cross-sectional views taken along line cuts Aa-Ee in the z direction. As shown in FIG. 3A, a patterned first layer 310 is formed on an underlying layer 301 of the substrate 300. The patterned first layer 310 includes a first structure, such as mandrels 311. For example, FIGS. 3A and 3A' can show an incoming topographic pattern after exposure and development of a first photoresist layer. Note that photoresist is used as the primary example herein, but the initial pattern can be either photoresist or other materials such as a hardmask material.

In FIGS. 3B and 3B', a grafting material 321 is deposited selectively on uncovered surfaces of the mandrels 311. As a result, the grafting material 321 adheres to top surfaces 311' and side surfaces 311" of the mandrels 311 without adhering to the uncovered top surfaces 301' of the underlying layer 301. Corresponding to the grafting material at step S202 in FIG. 2, the grafting material 321 includes the TAG as an example solubility-shifting material.

In FIGS. 3C and 3C', a filler material 331 is deposited on the substrate to form an overcoat over the mandrels 311. Similarly, the filler material 331 can be a polymer with a protecting group that reacts with acid to become more soluble in a given developer. Spin coating is a common way to deposit such an overcoat, and the resultant overcoat will typically not only fill space but also cover the first patterned first layer entirely. The overcoat may be planarized (flat as shown) or non-planarized (not shown). Further, the filler material should be effectively free of solubility-shifting materials, meaning that the filler material includes no solubility-shifting material or an insufficient amount of solubility-shifting material to reduce solubility change.

In FIGS. 3D and 3D', the TAG included in the grafting material 321 is diffused by a predetermined distance into an abutting portion of the filler material 341 so that the TAG changes solubility of the abutting portion of the filler material in the developer. In some embodiments, a bake step is executed, which causes the acid to diffuse into the filler material 331 making this diffused portion 341 soluble. After the acid has reacted with the filler material 331 to a selected distance, the substrate 300 can be baked at a yet higher temperature to decompose a cross-linker in the mandrels 311 to further reduce the solubility of the mandrels 311. For example, a post-exposure bake (PEB) for a particular resist can be around 90° C., while a TAG can be activated and diffused between 120-130° C. A given cross-linker can be activated with a bake of 150-160° C. In some embodiments, a TAG should be selected that does not decompose during the PEB of the initial pattern formation (i.e., the patterned first layer 310). According to some embodiments, the cross-linker should not decompose until after both PEB and TAG bake.

In this example, the TAG renders the abutting portion of the filler material 341 soluble to the developer. As a result, the abutting portion of the filler material 341 is removed in FIGS. 3E and 3E'. Specifically, a development step is executed that removes soluble portions (i.e., abutting portions) of the filler material 341. This leaves a narrow trench 351 on sidewalls 311" of the mandrels 311 so that the first structure (i.e., mandrels 311) is spaced apart from a second structure (i.e., the remaining filler material 331) by at least the predetermined distance. Any subsequent patterning can then be continued, such as masking a portion of the narrow trenches to selectively transfer to an underlying layer.

FIG. 4 shows schematic cross-sectional views and top-down views of a substrate 400 at various intermediate steps of pattern formation with a PAG in accordance with embodiments of the present disclosure. Similar to FIG. 3, FIG. 4 shows a method of forming narrow trenches and slot contacts using a grafting material with a functional group that is a PAG and can also be an embodiment of the method 200 in FIG. 2. Compared with a TAG, a PAG is more thermally stable and can offer spatial control via controlled exposure of actinic radiation.

Similarly, FIGS. 4A'-4F' are top-down views of the substrate 400, and FIGS. 4A-4F are corresponding cross-sectional views taken along line cuts A'a'-E'e' in the z direction. FIGS. 4A and 4A' show a patterned first layer 410 having mandrels 411 on an underlying layer 401. FIGS. 4B and 4B' show attachment of a grafting material 421 that includes a PAG to the mandrels 411. FIGS. 4C and 4C' shows overcoat of a filler material 431. In FIGS. 4D and 4D', a patterned photolithography exposure is executed where a photomask 441 is positioned over the substrate 400. The arrows represent incident light, such as ultraviolet light. In FIGS. 4E and 4E', a bake step causes acid generated from the exposure to diffuse by a predetermined distance into the fill material 451. This predetermined distance is a function of amount of acid generated, bake time, and bake temperature (for example) so the distance can be accurately controlled. FIGS. 4F and 4F' show narrow slots (e.g., narrow trenches) formation 461 after a development step.

FIGS. 5-8 illustrate embodiments for using functional grafting materials (e.g., a TAG, a PAG, or a base) to create gaps (e.g., narrow trenches) or connections (e.g., slot contacts) between structures or openings despite overlay errors or photolithographic misalignment, which can be embodiments of the method 200 in FIG. 2. Therefore, some descriptions have been provided above and will be omitted here for simplicity purposes.

Figure 5A:
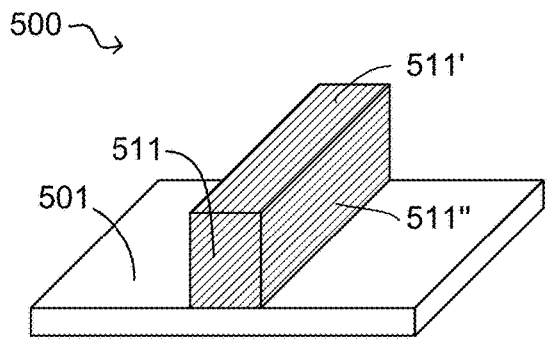
Figure 5B:
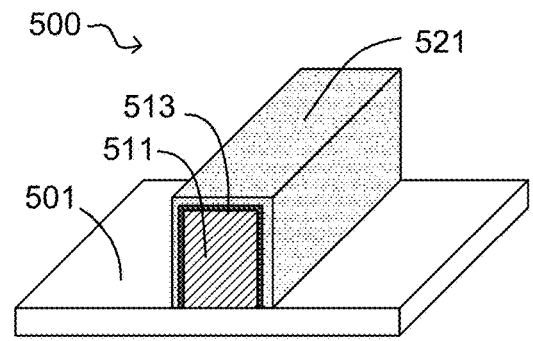
Figure 5C:
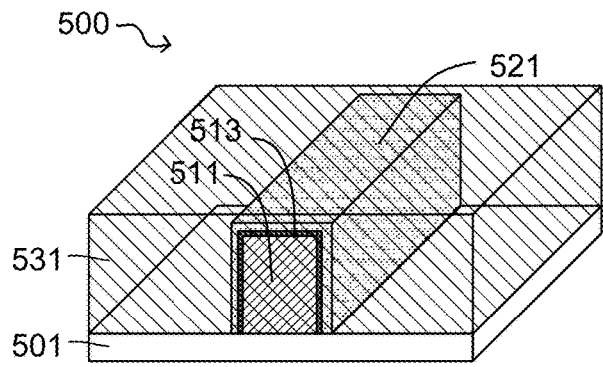
Figure 5D:
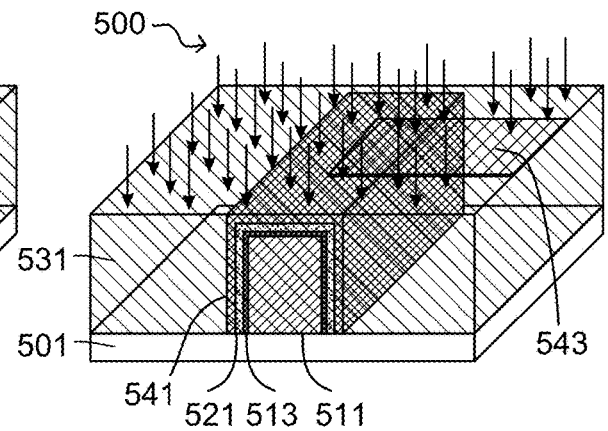
Figure 5E:
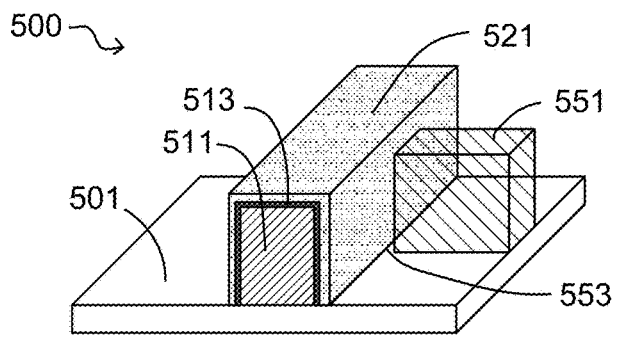
Figure 5F:
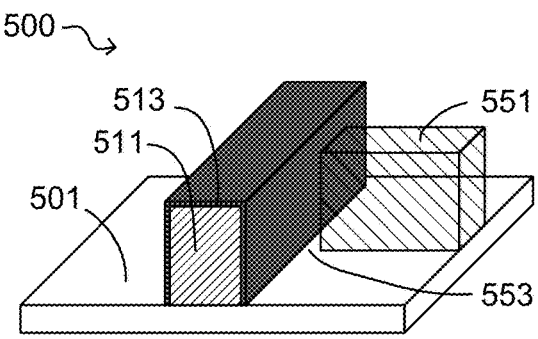
Figure 5:
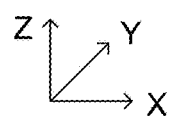
Figure 5:
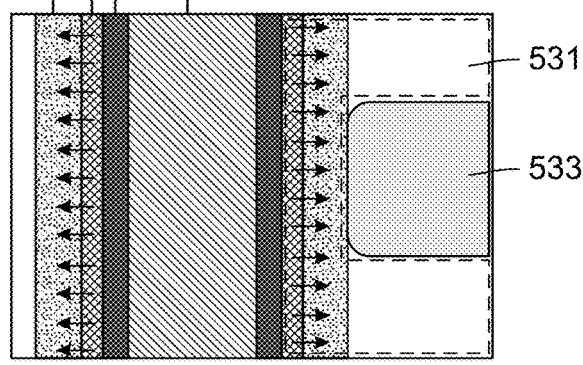
Figure 5:
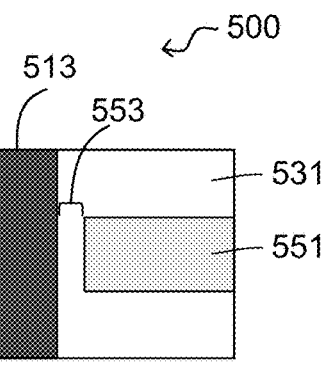
Figure 5:
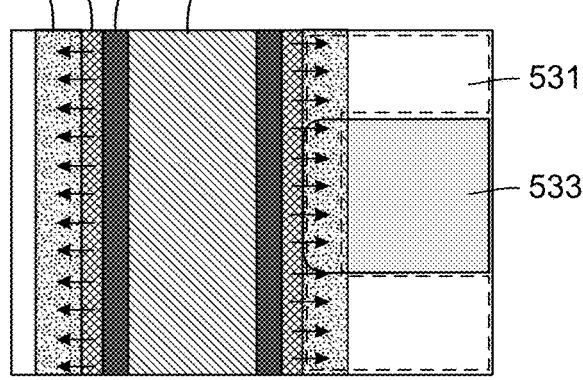
Figure 5:
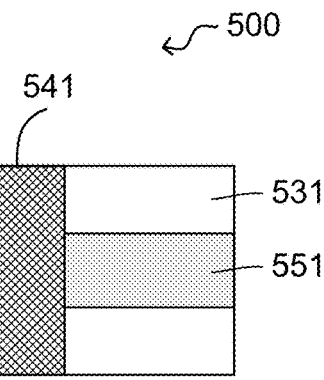

FIG. 5 shows schematic 3D views and top-down views of a substrate 500 at various intermediate steps of pattern formation in accordance with some embodiments of the present disclosure. FIG. 5A shows an incoming patterned line (structure) 511, which corresponds to the first structure in the method 200, on an underlying layer 501 of the substrate 500. In this example, the line 511 is made of a first photoresist material and formed by photolithography. This line 511 can be developed using a positive tone developer (PTD). After formation, a process step of direct-current superposition (DCS) can be executed to harden the photoresist line 511 to prevent it from becoming soluble. DCS can be accomplished in a plasma chamber by coupling negative direct current power to an upper electrode of the plasma chamber to generate a flux of ballistic electrons which strikes the substrate 500. Consequently, exposed surfaces of the line 511, including a top surface 511' and two side surfaces 511", change in physical properties, become insoluble in solvents, and form a new film 513 that surrounds the line 511. Cross-linking may occur within the film 513 during the DCS process. Additionally, other treatments, such as thermal freeze, gaseous freeze, and the like can also be utilized.

Next in FIG. 5B, a grafting material 521 with an acid functional group is coated on the line 511 (or more precisely, on the film 513). Then, a second photoresist material 531 can be deposited in FIG. 5C. In FIG. 5D, the substrate 500 is exposed to a second pattern of actinic radiation. The actinic radiation (represented by arrows) is applied through a photomask 543 that is positioned over the substrate 500 so that a latent second pattern (not shown) is formed within the second photoresist material 531. The acid functional group is then activated and diffused into the second photoresist material 531 by a predetermined distance to form a diffusion layer 541. Within the diffusion layer 541, the acid changes the solubility of the second photoresist 531 that has received sufficient acid. Herein, the acid renders the diffusion layer 541 soluble. In an embodiment where the acid functional group is a TAG, a bake step is executed for both activation and diffusion. In another embodiment where the acid functional group is a PAG, an actinic radiation (e.g., flood exposure or patterned exposure at a particular wavelength which the second photoresist material 531 is insentive to) is performed for activation and a subsequent bake for diffusion.

In FIG. 5E, the second pattern is developed, such as with a PTD, to remove soluble portions of the second photoresist layer 531, including the diffusion layer 541. Consequently, a second structure 551 is formed by the remaining insoluble second photoresist material 531. Further, a gap 553 is formed between the first structure 511 and the second structure 551. In some embodiments, the grafting material 521 may be removed to further widen the gap 553 as shown in FIG. 5F.

FIGS. 5M and 5N are top-down views of FIGS. 5D and 5E, respectively. In FIG. 5M, arrows represent the diffusion process while dashed lines represent an area exposed to the actinic radiation in FIG. 5D, and the latent pattern is represented by 533 which will eventually become the second structure 551. FIG. 5M shows that even if the exposure (i.e., the dashed line area) was misaligned so that the lines (i.e., 513 and 533) would be too close, the diffusion (i.e., 541) from the grafting material 521 essentially shortens the second line 533 approaching the first line 513 to "snap away" from the first line 513. In other words, in this embodiment acid is diffused into the second line 533 to make sure there is a gap 553 in FIG. 5N. This may provide many patterning benefits, such as preventing a short circuit current path between structures.

FIGS. 5P and 5Q are top-down views of a structure similar to FIGS. 5D and 5E, respectively, according to another embodiment where "snap to" structures are formed. This embodiment is similar to what has already been described for FIGS. 5A-5F, except that the grafting material 521 includes a base instead of an acid generator. The diffusion layer 541 is rendered insoluble by the base in a PTD that removes soluble portions of the second photoresist layer 531. Note that in FIG. 5M, despite the exposure of the second line 551 (i.e., the latent pattern 533) failing to reach the first line 513, the first line 513, after diffusion (i.e., 541), essentially becomes wider so that the two lines meet without a gap separating them.

FIG. 6 show schematic 3D views and top-down views of a substrate 600 at various intermediate steps of pattern formation in accordance with other embodiments of the present disclosure. Since FIG. 6 is similar to FIG. 5, explanation will be given with emphasis placed upon differences. Herein, an inverse photomask 643 is used so that the photomask 643 and the photomask 543 are complementary to each other. That is, in the current embodiment, an exposed area of the photomask 543 is a blocked area of the photomask 643, and an exposed area of the photomask 643 is a blocked area of the photomask 543. Further, the second photoresist material 631 is negative instead of positive.

FIGS. 6M and 6N are top-down views of FIGS. 6D and 6E, respectively, according to one embodiment where "snap away" structures are formed. Similarly, in FIG. 6M, arrows represent the diffusion process while a dashed line area represents an area exposed to the actinic radiation in FIG. 6D, and the latent pattern is represented by 633 which will eventually become the second structure 651. In this embodiment, the grafting material 621 includes a base (which can neutralize excess acid). The first line 611 is developed with a PTD, while the second line 651 is developed using a NTD. After exposure, note that in FIG. 6M a latent pattern 633 can extend to the grafting material 621 (so that the two lines would be in contact), but then diffusing the base away from the first line 613 can neutralize acid in the latent pattern of the second line 633 so that this material (i.e., the diffusion layer 641) remains insoluble to a NTD and can be removed subsequently to ensure a gap 653 between the first line 613 and the second line 651 in FIG. 6N.

FIGS. 6P and 6Q are top-down views of a structure similar to FIGS. 6D and 6E, respectively, according to another embodiment where "snap to" structures are formed. In this embodiment, the grafting material 621 includes an acid functional group (e.g., a TAG or a PAG). The first line 611 can be developed by a PTD or a NTD, and the second line 651 can be developed by a NTD. Similarly, joining of structures can be assured despite overlay errors. A latent pattern 633 is formed in a second photoresist 631 deposited on the substrate 600. Then diffusion (i.e., 641) from the first line 613 makes sure the two lines join. In other words, in the current embodiment the acid can be diffused from the first line 611 to make a region 641 around the first line insoluble to the NTD. After development of the second line 651, the first line 611 and the second line 651 are joined. Without the diffusion step, the result would be a gap between the two structures.

FIGS. 7 and 8 show "snap to" and "snap away" structures with openings (e.g., trenches) instead of lines as illustrated in FIGS. 5 and 6. FIG. 7 shows schematic 3D views and top-down views of a substrate 700 at various intermediate steps of pattern formation in accordance with other embodiments of the present disclosure. As shown, a first trench 711 is imaged between two lines 713 within a patterned first layer 710 on an underlying layer 701 of the substrate 700, and the first trench 711 is then coated with a grafting material 721 having a base functional group. Note that the grafting material 721 can be non-selectively deposited on all uncovered surfaces, including sidewalls 711", a bottom surface 711' of the first trench 711, and top surfaces 713' of the lines 713. Optionally, a spacer-open etch can be executed. This is a directional etch that removes the grafting material 721 from horizontal surfaces (i.e., the bottom surface 711' of the first trench 711 and top surfaces 713' of the lines 713), leaving sidewall (i.e., 711") deposits in the first trench 711 (not shown). Subsequently, the actinic radiation, diffusion, and development process steps are similar to corresponding steps in FIGS. 5 and 6, while the diffusion layer is not shown in FIG. 7C. Consequently, a second trench 741 is formed and spaced apart from the first trench 711 by a region 743 of the line 713.

FIGS. 7M and 7N are top-down views of FIGS. 7C and 7D, respectively, according to one embodiment where "snap away" structures are formed. In FIG. 7M, arrows represent the diffusion process while a dashed line area represents an area exposed to the actinic radiation in FIG. 7C, and the latent pattern is represented by 733 which will eventually become the second structure 741. In this embodiment, a grafting material 721 with a base is used. FIGS. 7M and 7N show the photo exposure has an overlay error that would cause first and second trenches (i.e., 711 and 741) to merge. That is, the latent pattern 715 generated by the actinic exposure through the photomask 731 is in contact with the grafting material 721 covering the first trench 711. However, diffusion (i.e., 743) from the grafting material 721 makes the region 743 between these trenches insoluble so that after development the two trenches are separated. Additionally, the first trench 711 and the second trench 741 can both be formed using a PTD.

FIGS. 7P and 7Q are top-down views of a structure similar to that of FIGS. 7C and 7D, respectively, according to another embodiment where "snap to" structures are formed. Similarly, arrows represent the diffusion process while a dotted area represents an area exposed to the actinic radiation in FIG. 7C, and the latent pattern is represented by 733 which will eventually become the second structure 741. In this embodiment, a grafting material 721 with an acid is used instead of with a base. FIG. 7P shows that the latent pattern 733 does not meet the first trench 711. The acid from the grafting material 721 is diffused, making a separating portion 743 of the photoresist soluble so that after development both trenches meet. That is, in this embodiment the latent pattern 715 is spaced apart from the first trench 711 according to the dashed line area defined by the photomask 731. Nevertheless, the acid from the grafting material 721 is diffused by a predetermined distance to effectively "widen" the first trench 711 so as to make sure that the first trench 711 and the second trench 741 merge. Additionally, the first trench 711 and the second trench 741 can both be formed using a PTD.

FIG. 8 shows schematic 3D views and top-down views of a substrate 800 at various intermediate steps of pattern formation in accordance with other embodiments of the present disclosure. FIG. 8 illustrates a similar process to FIG. 7, instead using an inverse photo pattern, as demonstrated by an inverse photomask 831. Accordingly, a PTD can be used for the first trench (711) development, and a NTD for the second trench (741) development. Other descriptions have been provided above and will be omitted here for simplicity purposes. Note that while FIG. 8 only shows an embodiment where "snap to" structures are formed, it should be understood that "snap away" structures can also be formed using this inverse photo pattern.

FIG. 9 show additional embodiments to form narrow trenches using an acid wash, which can be an embodiment of the method 100 in FIG. 1. FIGS. 9A'-9F' are top-down views of the substrate 900 at various intermediate steps of an example method, and FIGS. 9A-9F are corresponding cross-sectional views taken along line cuts A"a"-F"f" in the z direction. Acid wash flow is a three material process where the reactive species is driven into the mandrel by soaking the substrate in a solution of reactive species to create a self-aligned double pattern (SADP).

As shown in FIGS. 9A and 9A', the substrate 900 includes a patterned first layer 910 on an underlying layer 901. The patterned first layer 910 includes lines 911 that are made of a first photoresist material in this example. After forming photoresist lines 911, an acid 921 is deposited on the substrate 900 in FIGS. 9B and 9B'. In FIGS. 9C and 9C', a baking step can be executed to activate the de-protection in the de-protected area 931 by diffusing the acid 921 into the lines 911. This makes a certain thickness of the lines (i.e., the de-protected area 931) soluble in a given developer. Then, a solvent rinse step is required to remove any residual acid. A filler material 941, such as a second photoresist material, is then deposited in FIGS. 9D and 9D'. The filler material 941 should be compatible with the first photoresist solvent system in such a way that the de-protected areas 931 and the lines 911 remain on the substrate 900 after depositing the filler material 941, for example by a typical spin coating process. The filler material 941 is also designed so that an overburden can be removed in FIGS. 9E and 9E'. The soluble material 931 can then be developed, leaving narrow trenches 961 between the lines 911 (the first structure) and the remaining filler material 941 (the second structure) as shown in FIGS. 9F and 9F'.

FIG. 10 shows pattern formation on a substrate, in accordance with the example process of FIG. 9. FIG. 10 illustrates how two patterns can be formed on a substrate while maintaining sufficient distance between structures. FIG. 10 illustrates this embodiment using an acid wash to make sure structures do not merge, but a grafting material can also be used to make sure overlay errors do not cause structures to join.

In this approach, a pattern is split into two masks and recombined in successive lithography and etching steps, and a line or space width is defined by edges placed at separate masks. The benefit with techniques herein is minimizing effect of errors through diffusion based buffering and suitable resist. The decomposition of layout for multiple exposure steps is a challenge in an automated double patterning lithography (DPL) design flow. There are challenges identifying an optimum cut point on a polygon. Hence, techniques herein can overcome the challenges faced in layout decompositions or pattern stitching.

In this method, a trade-off between overlay problems due to the resolution limit by photolithographic Rayleigh criteria and sub resolution trenches due to acid diffusion is applied to solve the post-layout decomposition problems. The fiddling pattern overlap due to near proximity exposure can be prevented by using an acid diffusion spin-on material and two layer patterning.

FIG. 10A is a top-down view of a substrate 1000 after pattern formation using the example process of FIGS. 9. As shown, to generate a conflict free layout (i.e., a layout ensuring sufficient distance between structures), an initial photoresist pattern L1 is printed on the substrate 1000 (L1 is represented by an area defined by the dashed line). The printed pattern L1 is then coated with an acid wash (e.g., FIG. 9B). After coating the acid wash over the initial photoresist pattern L1 and baking to activate the de-protection in the de-protected area, a solvent rinse step is used to remove any residual acid (e.g., FIG. 9C). As a result, the remaining photoresist pattern L1 forms lines 1010. The pattern L1 is then coated with a second layer of resist 1020 (also referred to as Layer 2 or L2) (e.g., FIG. 9D). The L2 material must be compatible with L1 photoresist solvent system. The L2 material is designed in such a way that the overcoat area is removed as development loss of L2 as the L2 layer lacks the top coat (i.e., the aforementioned overburden as shown in FIG. 9E). Note that a factor in L2 design is dissolution rate both for the ability to remove the overcoat area of L2 during the L2 development, as well as defining how much feature shrink will happen during L2 development. This technique may be more successful with consistency in the height profile from the development loss for L2 and the diffusion length of the L1 (e.g., FIG. 9F). The development loss is measured as the difference in the thickness before and after development of L2 material. The development loss benefits from being engineered to be equal to the diffusion loss due to the acid wash. The diffusion area defines the gap area with a sub-resolution trench (e.g., the trench 961 in FIG. 9F), the resolution limited by the acid diffusion length which is about 7 nm.

FIG. 10B is an expanded view of the circle CirA in FIG. 10A, and FIG. 10C is a cross-sectional view taken along the line cut Gg in the z direction. FIGS. 10B and 10C further demonstrate the gap area between the line 1010 (L1) and the line 1020 (L2). Particularly, a width of the gap area, D represents a predetermined diffusion length by the acid during the baking process. The introduction of the acid wash to create the de-protected layer flow by pattern decomposition is a unique way to reduce the overlay error due to close proximity interactions. Thus, objectives herein help to reduce the overlay error due to resolution limit by the Rayleigh criterion. This can be used to sub-resolution trench. The resolution is limited by acid diffusion length of approximately 7 nm.

Figure 11:
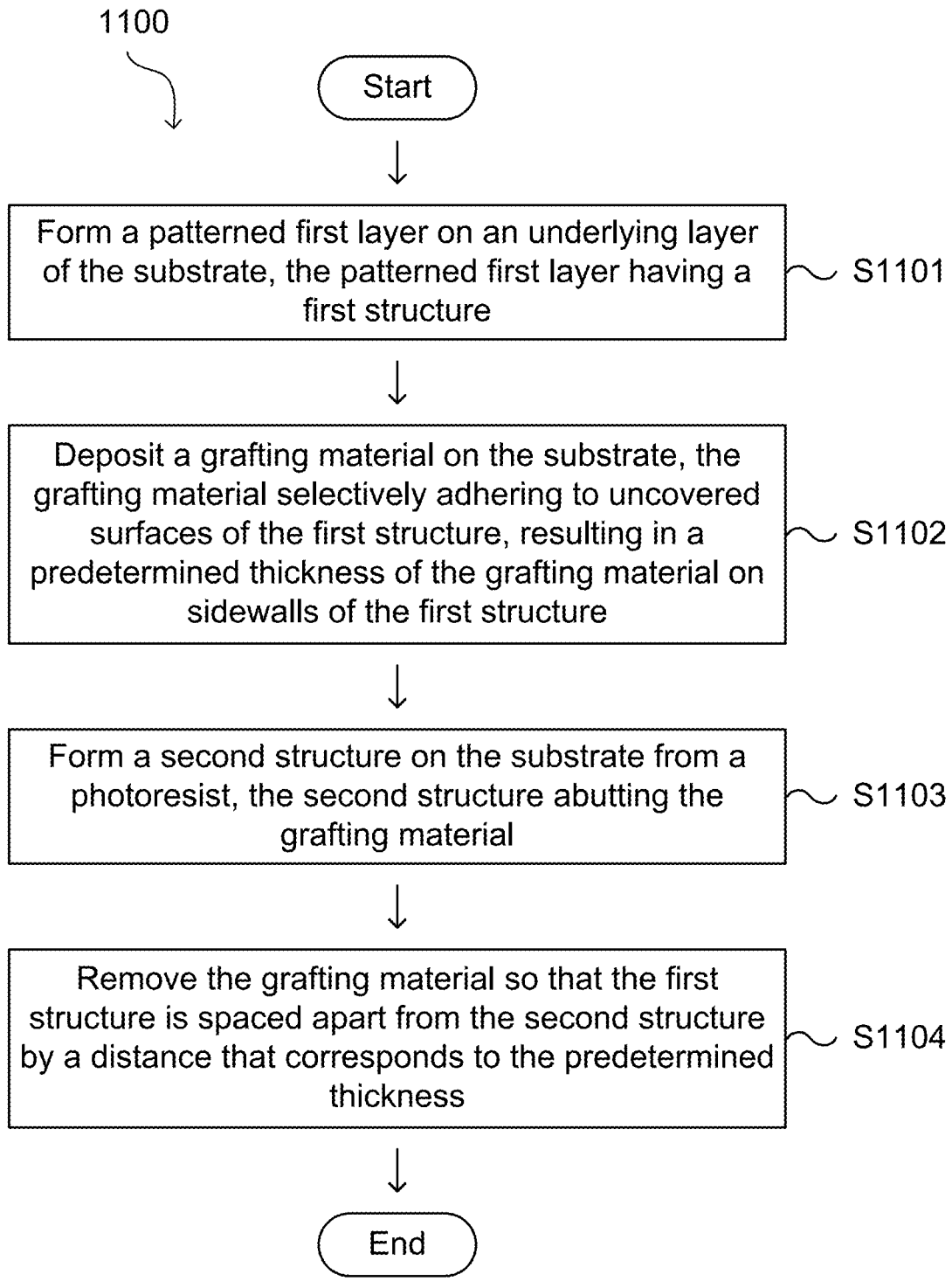
FIG. 11 is a flowchart of a method of forming a pattern on a substrate in accordance with an embodiment of the present disclosure.

FIG. 11 is a flowchart of a method 1100 of forming a pattern on a substrate in accordance with an embodiment of the present disclosure. The method 1100 starts with step S1101 where a patterned first layer is formed on an underlying layer of the substrate. The patterned first layer has a first structure. At step S1102, a grafting material is deposited on the substrate so that the grafting material selectively adheres to uncovered surfaces of the first structure, resulting in a predetermined thickness of the grafting material on sidewalls of the first structure. At step S1103, a second structure that abuts the grafting material is formed on the substrate from a photoresist. The method 1100 then proceeds to step S1104 where the grafting material is removed so that the first structure is spaced apart from the second structure by a distance that corresponds to the predetermined thickness.

FIG. 12 shows schematic 3D views and top-down views of a substrate 1200 at various intermediate steps of pattern formation in accordance with some embodiments of the present disclosure. While not shown in FIG. 12, a DCS process can also be executed to harden the line 1211 to prevent it from becoming soluble and form a film that covers the line 1211 as has been shown in FIG. 5. Since the example embodiment of the process flow in FIG. 12 is similar to the example embodiment of the process flow in FIG. 5, explanation will be given with emphasis placed upon differences. Herein, the grafting material 1221 may not necessarily include any solubility-shifting material As a result, a second structure 1251 is formed in contact with the grafting material 1221 with no gap in between as illustrated in FIG. 12E. The grafting material 1221 is then removed, leaving a gap 1261 between the two lines (i.e., 1211 and 1251) in FIG. 12F. FIG. 12 illustrates that even if the exposure pattern was misaligned so that it overlapped into the grafting material region 1221, the grafting material 1221 remains removable to leave a desired gap 1261 between lines. Alternatively, the grafting material 1221 may include a solubility-shifting material, but no diffusion process is performed to cause any diffusion. In other examples, the grafting material 1221 may include a solubility-shifting material, but an amount of the solubility-shifting material is insufficient to change solubility, or the film formed during the DCS process may prevent diffusion of the solubility-shifting material.

Another embodiment is a selective coat flow. In the selective coat flow, the initial pattern (e.g., a mandrel) can be either photoresist or a hard-mask material. On this initial pattern, a material is attached to the mandrel selective to the floor material. This pattern is then overcoated with another material, either organic or inorganic based. Then either through an RIE etch or develop, depending on the material matrix, the selective coat material is removed creating a narrow trench feature.

A related flow is an atomic layer deposition (ALD) flow. An ALD material is conformally deposited on a substrate. A spacer-open etch removed ALD material from all but vertical surfaces, leaving sidewall spacers. This spacer material provides a buffer to prevent structures from different masks to be joined. After both structures are exposed and developed, the spacer material can be exhumed such as by an etch process, leaving a desired gap between certain structures.

Various embodiments herein can benefit from various optimization techniques. For example, materials can be selected with components that have different and not overlapping decomposition temperatures (e.g., a TAG and a cross-linker). Solvent compatibility should be checked to apply an overcoat without stripping the initial pattern (e.g., a first photoresist and a second photoresist). Initial patterns of photoresist can be "frozen" or made insoluble using cross-linking to prevent mandrel dissolution in a subsequent developer (e.g., DCS).

The various embodiments described herein offer several advantages. For example, a narrow trench or a slot contact can be formed between two structures by diffusion of a solubility-shifting material, despite misalignment of a photomask. The diffusion process can reduce the overlay error due to resolution limit by the Rayleigh criterion and therefore form sub-resolution "snap to" and "snap away" structures.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/ or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method of forming a pattern on a substrate, the method comprising:
   forming a first layer on an underlying layer of the substrate, the first layer patterned to have a first structure;
   depositing a grafting material on side surfaces of the first structure, the grafting material including a solubility-shifting material;
   diffusing the solubility-shifting material by a predetermined distance into a neighboring structure that abuts the solubility-shifting material, the solubility-shifting material changing solubility of the neighboring structure in a developer; and
   removing soluble portions of the neighboring structure using the developer to form a second structure, wherein
   the first structure comprises a first opening of the first layer,
   the neighboring structure is a portion of the first layer,
   the first layer comprises a photoresist material, and
   the second structure comprises a second opening of the first layer, wherein a latent pattern of the second opening is formed by patterned exposure of the first layer to actinic radiation prior to diffusing the solubility-shifting material.

2. The method of claim 1, wherein:
   the solubility-shifting material renders the neighboring structure insoluble to the developer; and
   the first opening is spaced apart from the second opening by at least the predetermined distance.

3. The method of claim 1, wherein:
   the solubility-shifting material renders the neighboring structure soluble to the developer; and
   the first opening is joined with the second opening.

4. The method of claim 1, wherein:
   the solubility-shifting material comprises a thermal acid generator; and the method further comprises:
   activating the thermal acid generator by heat prior to diffusing the solubility-shifting material into the filler material.

5. The method of claim 1, wherein:
   the solubility-shifting material comprises a photo acid generator; and the method further comprises:
   activating the photo acid generator by actinic radiation prior to diffusing the solubility-shifting material into the filler material.

6. The method of claim 5, wherein the actinic radiation is performed with a photomask so that the solubility-shifting material is activated by patterned exposure of actinic radiation.

7. The method of claim 1, wherein the solubility-shifting material comprises a base that neutralizes an acid.

8. A method of forming a pattern on a substrate, comprising:
   forming a patterned first layer on an underlying layer of the substrate, the patterned first layer including a first material and the underlying layer including a second material that is chemically different from the first material, the patterned first layer having a first structure;
   depositing a grafting material on the substrate, the grafting material selectively adhering to uncovered surfaces of the first structure, the grafting material including a solubility-shifting material;
   depositing a filler material on the substrate, the filler material abutting the grafting material;
   diffusing the solubility-shifting material by a predetermined distance into an abutting portion of the filler material, the solubility-shifting material changing solubility of the abutting portion of the filler material in a developer; and
   removing soluble portions of the filler material using the developer so that the remaining portions of the filler material form a second structure, wherein
   the solubility-shifting material renders the abutting portion of the filler material insoluble to the developer; and
   the first structure is in contact with the second structure.

9. The method of claim 8, wherein the solubility-shifting material comprises a base that neutralizes an acid.

10. The method of claim 8, wherein the filler material comprises a photoresist material.

11. The method of claim 10, further comprising forming a latent pattern of the second structure in the photoresist material via patterned exposure of actinic radiation, prior to diffusing the solubility-shifting material into the filler material.

12. The method of claim 11, wherein the latent pattern overlaps the abutting portion of the photoresist material.

13. The method of claim 8, wherein the first structure comprises a mandrel or a line.

14. The method of claim 13, further comprising hardening the mandrel or the line prior to depositing the grafting material on the substrate.

15. A method of forming a pattern on a substrate, comprising:
   forming a patterned first layer on an underlying layer of the substrate, the patterned first layer including a first material and the underlying layer including a second material that is chemically different from the first material, the patterned first layer having a first structure;
   depositing a grafting material on the substrate, the grafting material selectively adhering to uncovered surfaces of the first structure, the grafting material including a solubility-shifting material;
   depositing a filler material on the substrate, the filler material abutting the grafting material;
   diffusing the solubility-shifting material by a predetermined distance into an abutting portion of the filler material, the solubility-shifting material changing solubility of the abutting portion of the filler material in a developer; and
   removing soluble portions of the filler material using the developer so that the remaining portions of the filler material form a second structure,
   wherein the solubility-shifting material comprises a base that neutralizes an acid.

16. The method of claim 15, wherein the filler material comprises a photoresist material.

17. The method of claim 16, further comprising forming a latent pattern of the second structure in the photoresist material via patterned exposure of actinic radiation, prior to diffusing the solubility-shifting material into the filler material.

18. The method of claim 17, wherein the latent pattern overlaps the abutting portion of the photoresist material.

19. The method of claim 15, wherein the first structure comprises a mandrel or a line.

20. The method of claim 19, further comprising hardening the mandrel or the line prior to depositing the grafting material on the substrate.

* * * * *